United States Patent
Lane

(10) Patent No.: US 9,496,120 B2
(45) Date of Patent: Nov. 15, 2016

(54) ADJUSTABLE MASS RESOLVING APERTURE

(71) Applicant: Glenn Lane Family Limited Liability Limited Partnership, Summerfield, FL (US)

(72) Inventor: Glenn E. Lane, New Smyrna Beach, FL (US)

(73) Assignee: Glenn Lane Family Limited Liability Limited Partnership, Summerfield, FL (US)

( * ) Notice: Subject to any disclaimer, the term of this patent is extended or adjusted under 35 U.S.C. 154(b) by 0 days.

(21) Appl. No.: 15/136,503

(22) Filed: Apr. 22, 2016

(65) Prior Publication Data

US 2016/0240349 A1    Aug. 18, 2016

Related U.S. Application Data

(62) Division of application No. 14/217,064, filed on Mar. 17, 2014.

(60) Provisional application No. 61/800,855, filed on Mar. 15, 2013.

(51) Int. Cl.
| | |
|---|---|
| H01J 37/30 | (2006.01) |
| C23C 14/48 | (2006.01) |
| C23C 14/54 | (2006.01) |
| H01J 37/317 | (2006.01) |
| H01J 49/06 | (2006.01) |
| H01L 21/265 | (2006.01) |

(52) U.S. Cl.
CPC ......... *H01J 37/3007* (2013.01); *C23C 14/48* (2013.01); *C23C 14/54* (2013.01); *H01J 37/3171* (2013.01); *H01J 49/062* (2013.01); *H01J 2237/152* (2013.01); *H01J 2237/31701* (2013.01); *H01L 21/265* (2013.01)

(58) Field of Classification Search
USPC .......................................... 250/492.21, 396 R
See application file for complete search history.

(56) References Cited

U.S. PATENT DOCUMENTS

| | | |
|---|---|---|
| 3,031,396 A | 4/1962 | Anderson |
| 3,055,113 A | 9/1962 | Grandjean |
| 3,191,092 A | 6/1965 | Baker et al. |
| 3,624,240 A | 11/1971 | Damm et al. |
| 3,643,123 A | 2/1972 | Haeff |
| 3,713,043 A | 1/1973 | Avivi et al. |
| 3,939,354 A | 2/1976 | Janes |
| 3,992,625 A | 11/1976 | Schmidt et al. |
| 4,107,537 A | 8/1978 | Forsen et al. |
| 4,172,008 A | 10/1979 | Fleet |
| 4,257,013 A | 3/1981 | Pike et al. |
| 4,397,809 A | 8/1983 | Salisbury |
| 4,434,130 A | 2/1984 | Salisbury |
| 4,574,004 A | 3/1986 | Schmidt-Ott et al. |

(Continued)

*Primary Examiner* — Kiet T Nguyen
(74) *Attorney, Agent, or Firm* — Saliwanchik, Lloyd & Eisenschenk

(57) ABSTRACT

Embodiments of the invention relate to a mass resolving aperture that may be used in an ion implantation system that selectively exclude ion species based on charge to mass ratio (and/or mass to charge ratio) that are not desired for implantation, in an ion beam assembly. Embodiments of the invention relate to a mass resolving aperture that is segmented, adjustable, and/or presents a curved surface to the oncoming ion species that will strike the aperture. Embodiments of the invention also relate to the filtering of a flow of charged particles through a closed plasma channel (CPC) superconductor, or boson energy transmission system.

20 Claims, 13 Drawing Sheets

(56) References Cited

U.S. PATENT DOCUMENTS

| | | |
|---|---|---|
| 4,636,287 A | 1/1987 | Pike et al. |
| 4,728,796 A | 3/1988 | Brown |
| 4,847,504 A | 7/1989 | Aitken |
| 4,859,973 A | 8/1989 | Leupold |
| H693 H | 10/1989 | Leupold |
| 4,893,103 A | 1/1990 | Leupold |
| 5,189,303 A | 2/1993 | Tanjyo et al. |
| 5,306,920 A | 4/1994 | King et al. |
| 5,359,621 A | 10/1994 | Tsunoda et al. |
| 5,496,798 A | 3/1996 | Sakai et al. |
| 5,554,857 A | 9/1996 | Benveniste |
| 5,917,393 A | 6/1999 | Kupiszewski et al. |
| 5,969,366 A | 10/1999 | England et al. |
| 5,981,955 A | 11/1999 | Wong et al. |
| 6,180,085 B1 | 1/2001 | Achilefu et al. |
| 6,322,706 B1 | 11/2001 | Ohkawa |
| 6,398,920 B1 | 6/2002 | Ohkawa et al. |
| 6,489,610 B1 | 12/2002 | Barofsky et al. |
| 6,528,216 B2 | 3/2003 | Park |
| 6,572,778 B2 | 6/2003 | Sterman et al. |
| 6,585,891 B1 | 7/2003 | Ohkawa |
| 6,608,316 B1 | 8/2003 | Harrison |
| 6,726,844 B2 | 4/2004 | Ohkawa et al. |
| 6,784,424 B1 | 8/2004 | Willoughby et al. |
| 6,803,590 B2 | 10/2004 | Brailove et al. |
| 7,095,019 B1 | 8/2006 | Sheehan et al. |
| 7,253,406 B1 | 8/2007 | Sheehan et al. |
| 7,312,444 B1 | 12/2007 | Willougbhy et al. |
| 7,399,980 B2 | 7/2008 | Vanderberg et al. |
| 7,479,644 B2 | 1/2009 | Ryding et al. |
| 7,541,558 B2 | 6/2009 | Smith et al. |
| 7,709,817 B2 | 5/2010 | Burgess et al. |
| 7,838,849 B2 | 11/2010 | Alcott et al. |
| 7,928,413 B2 | 4/2011 | Alcott et al. |
| 7,994,488 B2 | 8/2011 | Huang |
| 8,357,912 B2 | 1/2013 | Radovanov et al. |
| 8,368,033 B2 | 2/2013 | Lane |
| 8,436,318 B2 | 5/2013 | Sinclair et al. |
| 8,466,431 B2 | 6/2013 | Buff et al. |
| 8,471,476 B2 | 6/2013 | Kurunczi et al. |
| 8,501,624 B2 | 8/2013 | Koo et al. |
| 8,502,173 B2 | 8/2013 | Vanderberg et al. |
| 8,603,252 B2 | 12/2013 | Dimeo et al. |
| 8,604,418 B2 | 12/2013 | Colvin et al. |
| 8,604,443 B2 | 12/2013 | Sinclair et al. |
| 8,618,514 B2 | 12/2013 | Horsky et al. |
| 8,637,815 B2 | 1/2014 | Makarov et al. |
| 8,637,838 B2 | 1/2014 | Eisner et al. |
| 8,639,489 B2 | 1/2014 | Pannese et al. |
| 2004/0196127 A1 | 10/2004 | Perrin |
| 2005/0258380 A1* | 11/2005 | White .............. H01J 37/05 250/492.21 |
| 2006/0108931 A1 | 5/2006 | Park et al. |
| 2011/0266891 A1 | 11/2011 | Lane |
| 2011/0315867 A1 | 12/2011 | Lane |
| 2012/0104273 A1 | 5/2012 | Ryding et al. |
| 2012/0298854 A1 | 11/2012 | Hamby et al. |

* cited by examiner

ADJUSTABLE MASS RESOLVING APERTURE

CROSS-REFERENCE TO RELATED APPLICATION

The present application is a divisional application of U.S. patent application Ser. No. 14/217,064, filed Mar. 17, 2014; which claims the benefit of U.S. Provisional Application Ser. No. 61/800,855, filed Mar. 15, 2013, all of which are incorporated by reference herein in their entirety, including any figures, tables, or drawings.

FIELD OF THE INVENTION

Embodiments of the present invention relate to a mass resolving aperture that may be used in, for example, an ion implantation system, such as the implantation system shown in FIG. 1A (prior art). Further embodiments relate to the filtering of a flow of charged and/or uncharged particles through, for example, a closed plasma channel (CPC) superconductor, or boson energy transmission system, such as the PC shown in FIG. 1B (prior art).

BACKGROUND OF THE INVENTION

Ion implantation is a preferred method of the semiconductor industry to make the scale of the integrated circuits smaller and the computing power of the semiconductor substrate (e.g., silicon chip) greater. Conventional ion implantation devices have fundamental commonalities. The work piece 335 (e.g., silicon chip) is rotated into the system from an external source when it has been processed to the point that it is prepared for implantation. The ion source 302 is at the other end of the production system (feedstock for ionization may be antimony, arsenic, phosphorus for n type junctions or boron, gallium, indium for p type junctions). Generally, positive ions are used, but negative ions may be used as well. During the beam assembly and ion implantation process, usually, most or all of the system is evacuated so that ions, in the ion beam, do not collide with residual gases. System wide power 301, 340, 339 is supplied where needed and a control system 338 and/or operator oversees the entire process. An ion source feedstock is selected based on p or n type junctions. That ion source is ionized by various methods and extracted through an opening in the ionization chamber 303 by an electrode 305, 336 biased to energize the emitted ion beam 309, generally, at a relatively high energy to mitigate against the propensity for space charge blow-up of like charged ions. The emitted ions form a relatively dense (high current) beam 309 that enters into a beam guide 317 that has a mass analyzer 310, consisting of dipole and/or quadrapole magnetic and/or EM fields that bend the ion beam, within a practical envelope, at an angle approximating 90 degrees from the original flight path. Ion species within the ion beam have differing charge to mass ratios. Consistent integrated circuits on the wafer fall within set parameters of charge to mass ratio for ions that are implanted. Incorrect charge to mass ratio species in the emitted ion beam 309 are eliminated after extraction by the mass analyzer 310 and the mass resolution aperture 314. Differing mass will have differing momentum for that ion species that will isolate the trajectories through the mass analyzer 310. The magnetic fields in the system are controlled so that ion species of greater charge to mass ratio than desired will hit one wall of the beam guide 311 and those species having less charge to mass ratio than desired will hit the other side of the beam guide 311, both being eliminated from the continuing ion beam.

Subsequently, in most conventional ion implantation systems, the ion beam reaches the mass resolving aperture 314. The beam current selected by the mass analyzer 310 has mostly the desired ion species, but still contains some species that are close to the desired mass to charge ratio, but not quite. The mass resolving aperture 314 will have an opening that is smaller than the ion beam envelope emerging from the mass analyzer 126 and will resolve (eliminate) the ion species outside the set aperture opening; those ion species strike the sides of the mass resolving aperture 314 and deposit there.

The testable quality of the product wafer (or other implanted surface) will rely on the consistency of the implants. Both prior to the implantation and/or during the actual implantation, the beam will be scanned 322 and profiled 331, generally, downstream from the aperture 314. The control system 338 would be capable of interpreting the beam profile information, sent to the beam diagnosis system 333, to adjust the aperture at the optimum opening to allow the maximum current within best design parameters of charge to mass ratio for the specific implantation. The present invention gives the control system 338 and the controllers a high degree of flexibility to optimize the beam at the point of the mass resolving aperture 314 by incrementally excluding incorrect ions, with the capability of adjustments in real time.

Downstream from the mass resolving aperture 314, there are a number of other processes and optical effects that may be employed to focus, bend, deflect, converge, diverge, scan, parallelize, and/or decontaminate the ion beam. FIG. 1 is used by way of example, as a conventional ion implantation device. The mass resolving aperture is 314, located just past the mass analyzer 310 in the ion beam envelope 309. Other ion implantation systems vary based on proprietary uses. As, stated before, fundamentals such as the mass resolving aperture are common in almost all of such systems.

The demand for electrical energy in the contiguous U.S. was 746,470 MegaWatts in 2005. Most of the energy was produced by coal (49.7%), nuclear energy (19.3%), and natural gas (18.7%). Unfortunately, transmission of energy from the point of generation to the point of retail sale remains highly inefficient. Energy losses of between 5-8% in 2005 translate to nearly twenty billion ($20,000,000,000) dollars in lost revenues. Nearly all the energy produced passes through high voltage power lines which is then delivered to cities, businesses, and residential areas after being stepped down to lower voltages.

All high voltage power lines use insulated copper wiring due to its relatively cheap cost and electrical resistivity of $17.2 \times 10^{-5}$ Ωm, which is good for metals. While these cables allow over 700,000 volt electricity transmission, power lines using copper have serious shortcomings and limitations due to mechanical and electrical constraints of hanging wires. For instance, transmission of electricity through copper cables is incredibly inefficient, with a tremendous amount of energy lost in the form of heat created by resistance of electricity passing through the cable. Moreover, the heat generated can cause deformation and failure of the transmission lines, particularly if they are too long. Other problems include costly rights of way which must be obtained to ensure use of the land for towers which, like the cables suspended therefrom, present aesthetic drawbacks.

Underground cables have several advantages over suspended power cables including longer transmission distances, higher electric loads, reduced right of way property costs and no aesthetic disturbance. Buried copper lines also support minimal weight and have better dielectric insulative coatings which reduce dielectric losses of electricity as compared with hanging lines. However, efficiency loss resulting from resistance is still a major problem. Cryogenic cables are a second underground transmission line option, but require liquid nitrogen stations to remain cooled in conjunction with the other costs. Superconductor power transmission lines are an attractive solution because they would exhibit zero loss due to no electrical resistivity; however processing of the single crystal material into wires of any useful length remains impracticable if not impossible.

Clearly there exists a longstanding need for a more efficient means of transmitting energy over long distances. In order to meet the need in the art, a method and apparatus for power transmission through a confined plasma subjected to a magnetic and/or electromagnetic field is provided.

It is known that glass tubes with electrodes at each end and filled with a noble gas can transmit electricity. These gas tubes are similar to neon tubes when an external electric field is applied. Plasma forms inside the tube under an alternating current electric field of high voltage which ionizes the gas or a portion thereof. Electrons become freed from the parent gas molecules and electrical conductivity is increased relative to that of the gas before the applied electric field. These electrons behave similarly to the free electrons in a metal such as copper.

Even a partially ionized gas in which as little as 1% of the particles are ionized can have the characteristics of a plasma (i.e., response to magnetic fields and high electrical conductivity). The term "plasma density" usually refers to the "electron density", that is, the number of free electrons per unit volume. The degree of ionization of a plasma is the proportion of atoms which have lost (or gained) electrons, and is controlled mostly by the temperature. A plasma is sometimes referred to as being "hot" if it is nearly fully ionized, or "cold" if only a small fraction (for example 1%) of the gas molecules are ionized. "Technological plasmas" are usually cold in this sense. Even in a "cold" plasma the electron temperature is still typically several thousand degrees Celsius.

The electrical conductivity of plasmas is related to its density. More specifically, in a partially ionized plasma, the electrical conductivity is proportional to the electron density and inversely proportional to the neutral gas density. Put another way, any portion of the gas medium that is not ionized, or that exists by virtue of recombination of its charged particles, will continue to act as an insulator, creating resistance to the transmission of electricity therethrough. The subject invention exploits a plasma's responsiveness to magnetic fields (as well as that of the paramagnetic gas medium) to substantially or entirely obviate this resistance during energy transmission in a manner more fully described herein. Accordingly, the transmission efficiency will be substantially independent of distance but rather a function of 1) ionization, 2) vacuum quality, and 3) magnetic field stratification. Ionization would be optimum photo-electric ionization maintained by UV light saturation; vacuum quality would be high to extremely high, with the determining factor being the MFP (mean free path) of the non-ionized molecules present; magnetic field stratification would be the effect of the static magnetic field to regionalize the non-participating molecules and particles within the chamber.

SUMMARY OF THE INVENTION

Embodiments of the present invention relate to a mass resolving aperture that may be used in an ion implantation system, such as the conventional ion implantation system shown in FIG. 1A, or other devices that selectively exclude ion species based on charge to mass ratio (and/or mass to charge ratio) that are not desired for implantation, in an ion beam assembly. A specific embodiment relates to a MRA that can be used in the ion beam assembly 308 process shown in FIG. 1A. Ion Implantation systems are used by the semi-conductor industry to create, for example, computing circuitry. One of the simplest, yet most important components of these systems is the mass resolving aperture 314. The mass resolving aperture 314 is located downstream from ion extraction 307 and the mass analyzing beam guide 310. The mass resolving aperture 314 resolves the ion species that are close to the desired charge to mass ratio, but, not in the parameters of the specific implantation. The desired species of ion will pass through the aperture opening and the undesired species will be eliminated by hitting the aperture surfaces facing the ion beam. Undesired ion species hit the surface of the aperture flush, sputter, partly, into the ion beam, and cause a residue build-up. Such a residue build-up may come loose and may cause contaminants to be entrained in the ion beam and find their way to the work piece 335. Because of aggressive scaling efforts to make integrated circuits smaller, there are evolving strategies, such as: using higher beam currents, implanting at lower energies, using cluster molecules of greater mass, using alternative ion sources such as germanium (with small range of mass dispersion in the beam guide), using multiple ion sources and other advances that make it desirable to refine the ion exclusion process.

Embodiments of the present invention also relate to the filtering of a flow of charged particles through a closed plasma channel (CPC) superconductor, or boson energy transmission system, such as the PC shown in FIG. 1B. Specific embodiments relate to a method and apparatus for filtering a regionally segregated flow of charged particles, such as the components of an ionized or partially ionized medium, within an elongated ionization chamber according to the charge and/or mass (such as mass-to-change ratio), where the ionization chamber provides a low resistance or no-resistance conductive path for the transmission of the charged particles. Embodiments of the subject apparatus have multiple applications and may also be described as a low energy particle accelerator.

Embodiments of the present invention relate to a mass resolving aperture that is segmented, adjustable, and/or presents a curved surface to the oncoming ion species that will strike the aperture. An adjustable mass resolving aperture can allow the controller and/or control systems to perform an increased variety of functions. Embodiments with the ability to make adjustments to the mass revolving aperture before, during, and/or after the implantation cycle can provide advantages. Embodiments incorporating curved surfaces retain deposited residue behind the curved surface and away from the ion beam, such that the portion of the ion beam that reaches the work piece 335 is less likely to have such residue become entrained within the ion below. Excluded ion species can hit the mass resolving aperture on the curved surface, which can mitigate against sputtering of incorrect ion species.

Embodiments of a segmented aperture can incorporate any number of segments. For simplicity, segments will be discussed by function. In an embodiment, different regions, or segments, of the body of the aperture can have different electric charges and/or magnetic polarity, which can influence the motion of ions traveling nearby in order to enhance the selection of ions. In further embodiments, each side of the aperture is movable with respect to the other sides such that each side can move or slide either independently or in concert with the other sides. In this manner, the aperture opening can be controlled, such as manually or by actuators controlled manually or by the operating system. Such adjustments can be made in real time, to form a desired dimensioned aperture opening at a desired position with respect to the cross-section of the beam of charged particles and/or with respect to the axis of the beam of charged particles. By adjusting in real time an ion beam can be tuned during implantation, and can optionally be adjusted based on feedback from measurements taken downstream from the MRA. The desired dimensioned can be based on beam profile feedback, predetermined prior to operations or otherwise determined, such as based on the beam envelope originating from the ion source, or the desired mass to charge ratio and/or resolution.

Dimensions of the desired aperture opening can include shape, height, and width. Additionally, the face of one or more of the apertures may be segmented (e.g., have a charge and/or magnetic polarity or other magnetic property), isolated magnetically, and/or insulated electrically, so that the face may perform one or more functions in addition to mechanical interference. By way of example, the aperture surface facing the incoming ion beam (e.g., have a normal with a component parallel to the beam path and in the opposite direction to the travel of the ion beam) may be: (i) segmented so that such surface performs the function of a Faraday flag or beam profiler; and/or be magnetized so such surface performs the functions of a Wien filter. By way of example, the aperture surface facing the ion beam as the ion beam exits the aperture may be an electrode that is biased to accelerate/decelerate, focus/defocus, optically influence, and/or be a ZFE-limiting element and/or be employed during certain cleaning procedures. In specific embodiments, the entire mass resolving aperture opening can be moved side to side on the X axis, up or down on the Y axis, forward or back on the Z axis, in relation to the incoming ion beam (e.g., see FIG. 1B).

As herein disclosed, embodiments of the subject invention may include a curved surface for portions of the mass resolving aperture in contact with or influencing the motion of the beam of charged particles. By way of example, the inside surface of the aperture that forms the opening, and/or faces the oncoming ion beam, can form an edge. The surface can be curved so that the edge has a leading portion that is closest to the oncoming beam and the surface is convex in a direction away from the leading portion of the edge and toward the outer portion of the beam (e.g., curves away from the beam). Further embodiments can have a concave surface adjacent the leading portion in a direction away from the opening. Having a convex surface that curves away from the leading portion can mitigate against sputtering of eliminated ion species hitting the MRA, as the eliminated ions hit a curved surface instead of hitting flush on a flat surface. Further embodiments can have a concave segment of the surface adjacent the concave portion. Residue on the aperture will then be radially outside of the edge and axially upstream of the edge, e.g., behind the curved surface and less able to be entrained in the ion beam. Ion species hitting the aperture surface radially outward of the edge at the point of separation can be deflected out of the ion beam by the curved surface. The segmentation and the curve of aperture may be employed together or separately to improve the uniformity and productivity of the ion implantation process, particularly regarding higher beam current, lower energies at work piece, molecular cluster ions, remote or multiple ion sources and other aggressive scaling strategies.

Embodiments of the present invention relate to a system that may be characterized as a closed plasma channel (CPC) superconductor, or as a boson energy transmission apparatus. Specific embodiments relate to modifications and improvements of the systems and method disclosed in U.S. Pat. No. 8,368,033, which is hereby incorporated by reference in its entirety for such teaching. In a first preferred embodiment, the apparatus is comprised of an ionization chamber (also referred to herein in some embodiments as a "plasma separation chamber") comprising an ionization vessel (also referred to herein in some embodiments as a "plasma separation vessel") having an ionization space (also referred to herein in some embodiments as a "plasma separation space"), and photoionization means operably associated with the ionization space for ionizing a plasma precursor gas or vapor confined therein under vacuum into a plasma comprised of ions, electrons and non-ionized gas or vapor (hereinafter "plasma components"). Preferably, the plasma precursor gas or vapor is paramagnetic. Ionization is established and maintained by the photoelectric effect of a light source of suitable wavelength to produce the most conductive transmission medium.

In a second preferred embodiment, plasma may be charged to the above-described vessel rather than created within the vessel itself. In either instance, magnetic field producing means are employed to produce an axially homogeneous static magnetic field within the transmission space to substantially separate the plasma components into "regions" or "channels" located parallel to the central longitudinal axis of the vessel. Each channel is established along the entire length of the ionization space. At least one channel is established comprised primarily of free-electrons which, in one application of the subject invention, provide a path of least resistance for the transmission of electricity therethrough. In other embodiments, an oscillating magnetic field (an electromagnetic field or "perturbing field") is introduced within the transmission space to stimulate movement of charged particles through the conduit. Various additional embodiments of the subject method and apparatus are described including a hybrid system for the transmission of alternating current or, alternatively, multi-pole EM fields through the cylindrical wall and direct current or charged particles through at least one of the regionalized channels and this process can serve as a superconductor, a low energy particle accelerator, as well as other applications. In all embodiments, the aforementioned photoionization means may be employed to sustain the plasma (i.e., prevent recombination of its components). Methods of enhancing efficiency of transmission of charged particles through the transmission space are described.

Plasma components of varying compositions and densities that have a magnetic or paramagnetic quality will react with a discrete magnetic polarity within the transmission space into substantially separate regions or "gradations" ordered by conducting to insulating properties, the mass/charge ratio of each component lending itself to either a greater or lesser response to the static magnetic field. The location of the conducting region or gradation can thereby be manipulated using different magnetic field producing means, including one embodiment where the conducting layer is primarily at the center of the field and another where it is primarily oriented along the interior wall surface of the conduit.

In those embodiments wherein the conducting channel is at the center of the field, an electromagnetic (EM) field, say alternating current or any multipole field, can be applied. In this instance, the EM field is referred to as the "perturbation field" along the wall of the conduit and the first magnetic field as the "stratum field" focusing the conducting channel towards the center. While this second EM field may work to perturb the stratum of the original field, its influence will be refined to attract and repel the charged particles (i.e., DC current) or pull-push in such a way as to accelerate or enhance the flow to receiving means located at the retrieval end of the conduit. The wall charge will also be retrieved by the same or additional receiving means located at the receiving end. Further embodiments can use the same principles in different combinations for different purposes.

Another important aspect of the invention, is the use of photoionization within the conduit. The plasma medium will be sustained at maximum conductivity levels with light levels and wavelength qualities seen in nature where plasma is the most abundant state and a bosonic energy carrier. Plasma densities, in the subject apparatus and methods, are relatively sparse as compared with other applications in the field of magnetohydrodynamics (MHD) to reduce the resistivity of kinetic effects. The plasma state that is sustained in the subject conduit is more akin to a space plasma than it is to a fusion plasma. The subject apparatus and methods are designed to mimic the natural state of plasma which prevails outside the earth's atmosphere, in "space," which is proven to be an efficient energy transmission medium over vast distances. In order to achieve that the CPC is going to require vacuum qualities that are high to extremely high. The determining factor is the "mean free path" (MFP) of the foreign molecules in the chamber. The MFP has to be long enough to overcome resistance that would be caused by collisions interfering with the path of the charge, aided by the static magnetic field drawing interfering molecules away.

Specific embodiments of the subject invention relate to a CPC, or a system for ionizing a precursor in a vessel and imparting a force to the resulting ions to form an ion beam and including a filter on an inside surface of the vessel, such as fins, curved surfaces, or segmented protrusions, to impact the motion of certain ions in the ion beam (e.g., diverting the ions, deflecting the ions, and/or removing the ions from the ion beam).

There has thus been outlined, rather broadly, the more important components and features of the invention in order that the detailed description thereof that follows may be better understood, and in order that the present contribution to the art may be better appreciated. There are, of course, additional features of the invention that will be described hereinafter and which will form the subject matter of the claims appended hereto. In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

For a better understanding of the invention, its advantages and the specific objects attained by its uses, reference should be had to the accompanying drawings and descriptive matter in which there is illustrated a preferred embodiment of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DETAILED DESCRIPTION OF THE PREFERRED EMBODIMENT

Figure 1A:
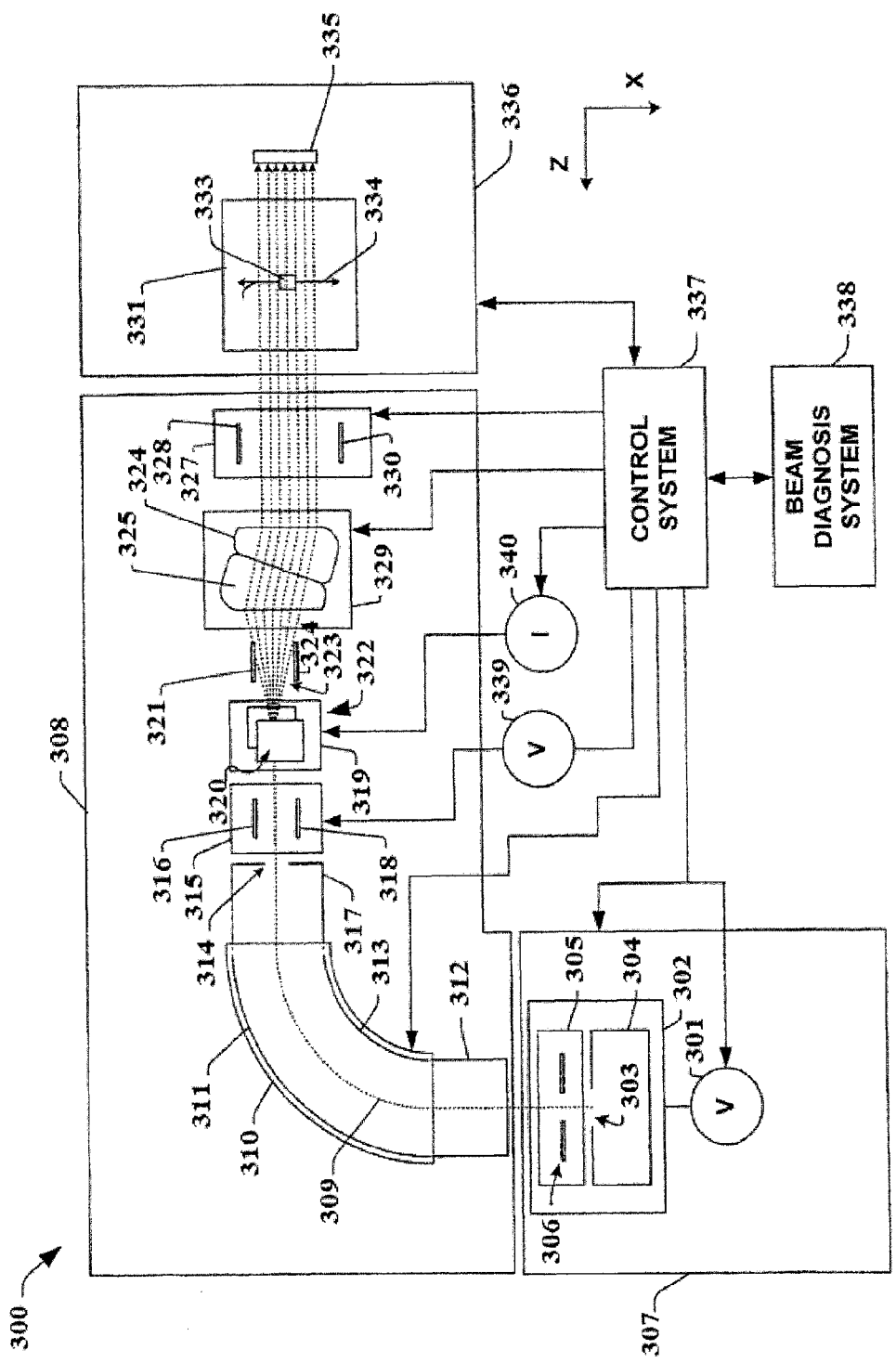
FIG. 1A is reproduced from U.S. Pat. No. 8,637,838 B2 and is used as an example of an ion implantation system that can provide subsystems for embodiments of the subject invention and/or can be modified in accordance with embodiments of the subject invention.

At the outset, it should be clearly understood that like reference numerals are intended to identify the same structural elements, portions or surfaces consistently throughout the several drawings figures, as such elements, portions or surfaces may be further described or explained by the entire written specification, of which this detailed description is an integral part. Unless otherwise indicated, the drawings are intended to be read (e.g., cross-hatching, arrangement of parts, proportion, degree, etc.) together with the specification, and are to be considered a portion of the entire written description of this invention. Components are not drawn to scale or proportion. As used in the following description, the terms "horizontal" and "vertical" simply refer to the orientation of an object relative to level ground, and the terms "left", "right", "top" and "bottom", "up" and "down", as well as adjectival and adverbial derivatives thereof (e.g., "rightwardly", "upwardly", etc.), simply refer to the orientation of a surface relative to its axis of elongation, or axis of rotation as appropriate.

FIG. 1A, which is FIG. 1 of U.S. Pat. No. 8,637,838 reproduced here as existing art, illustrates a conventional ion implantation system. Conventional ion implantation systems typically have a mass resolving aperture 314. FIG. 1A shows a system incorporating MRA. Embodiments of the subject invention pertain to the system of FIG. 1A, subsystems shown in FIG. 1A and embodiments described in U.S. Pat. No. 8,637,838 regarding the system, and subsystems, shown in FIG. 1 of U.S. Pat. No. 8,637,838 and modifications thereto described in U.S. Pat. No. 8,637,838, which is hereby incorporated by reference in its entirety, which incorporate one or more MRA in accordance with one of the embodiments of the MRA described herein at one or more positions of the ion path along the length of the ion path. The present invention will work with other systems having a mass resolving aperture.

With respect to an embodiment of the subject invention, referring to FIG. 1A, the workpiece 335, for example a silicon wafer, is implanted by an ion beam at the end station 336 of the system. The ion beam 309 is generated at the terminal 307. The ion beam is directed along a path in the beam line assembly 308 to the end station 336.

The system can be evacuated by pumps (not shown) to mitigate ion beam collisions with other particles. The ion source 302 can be an ionized gas of a dopant material (not shown) ionized within a generation chamber 304. The method of ionization is not shown but may be, for example, hot cathode, RF, microwave, electron bean injection, or other mechanism that would excite free electrons sufficient to collide with the dopant gas molecules and generate ions. The ions move through slit 303 and are extracted by the ion extraction assembly 305.

The extraction assembly 305 is biased to extract the ions at a relatively high energy. Generally, systems transfer the beam throughout the system at a relatively high energy, so the particles have sufficient momentum to overcome repulsive forces that can lead to beam blow up. Then, before impact with the workpiece 335, there are deceleration 327 stages, which may include electrode assemblies or other devices to decelerate the ions so that they have shallow impacts with the wafer for small junctions or ultra-shallow junctions (USJ). Note, although the deceleration stage 327 is shown as electrode plates 328 and 330 that are parallel to the ion beam, other deceleration stages can utilize electrodes that are perpendicular to the beam path, having apertures through which the beam travels.

Upon extraction, the ion beam 309 passes from the terminal 307 to the beamline assembly 308. In the embodiment shown in FIG. 1B, the mass analyzer 310 is formed at about ninety degree angle and presents a magnetic field that bends the beam 309. The magnets are not shown is this diagram. The rest of the beam line assembly includes the beam guide 317, a mass analyzer 310, a scanning system (320, 319, 122), electric element 339, and a parallelizer 329.

Figure 1B:
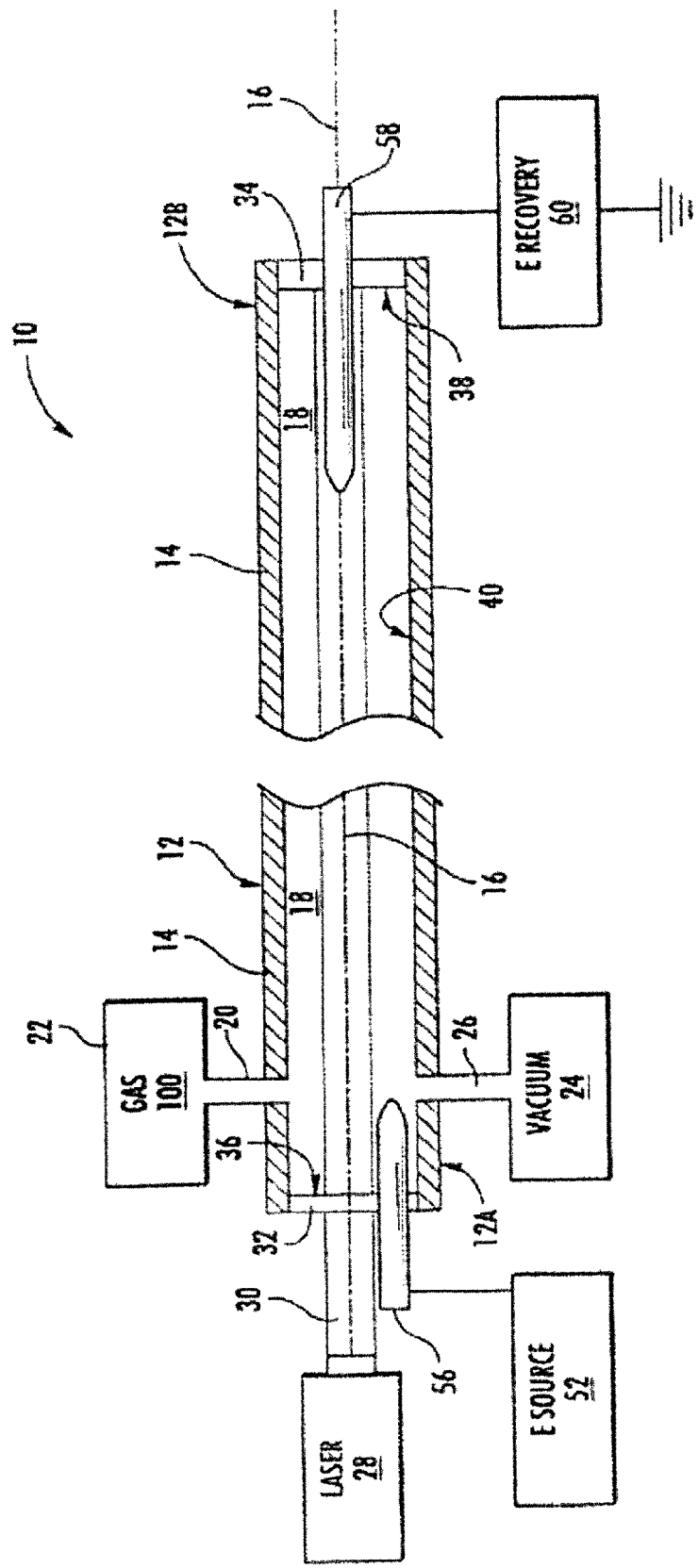
FIG. 1B is reproduced from U.S. Pat. No. 8,368,033 and is used as an example of a closed plasma channel apparatus that can provide subsystems for embodiments of the subject invention and/or can be modified in accordance with embodiments of the subject invention.

FIG. 1B, which is FIG. 1 of U.S. Pat. No. 8,368,033 reproduced here as existing art, illustrates a closed plasma channel superconductor, or as a boson energy transmission apparatus. Embodiments of the subject invention can incorporate one or more fins or protrusions having a curved surface protruding from the inside surface of wall 14 of the ionization vessel 12, such that such fin or fins impact the motion of the ion beam and/or remove ions from the ion beam.

Figure 2:
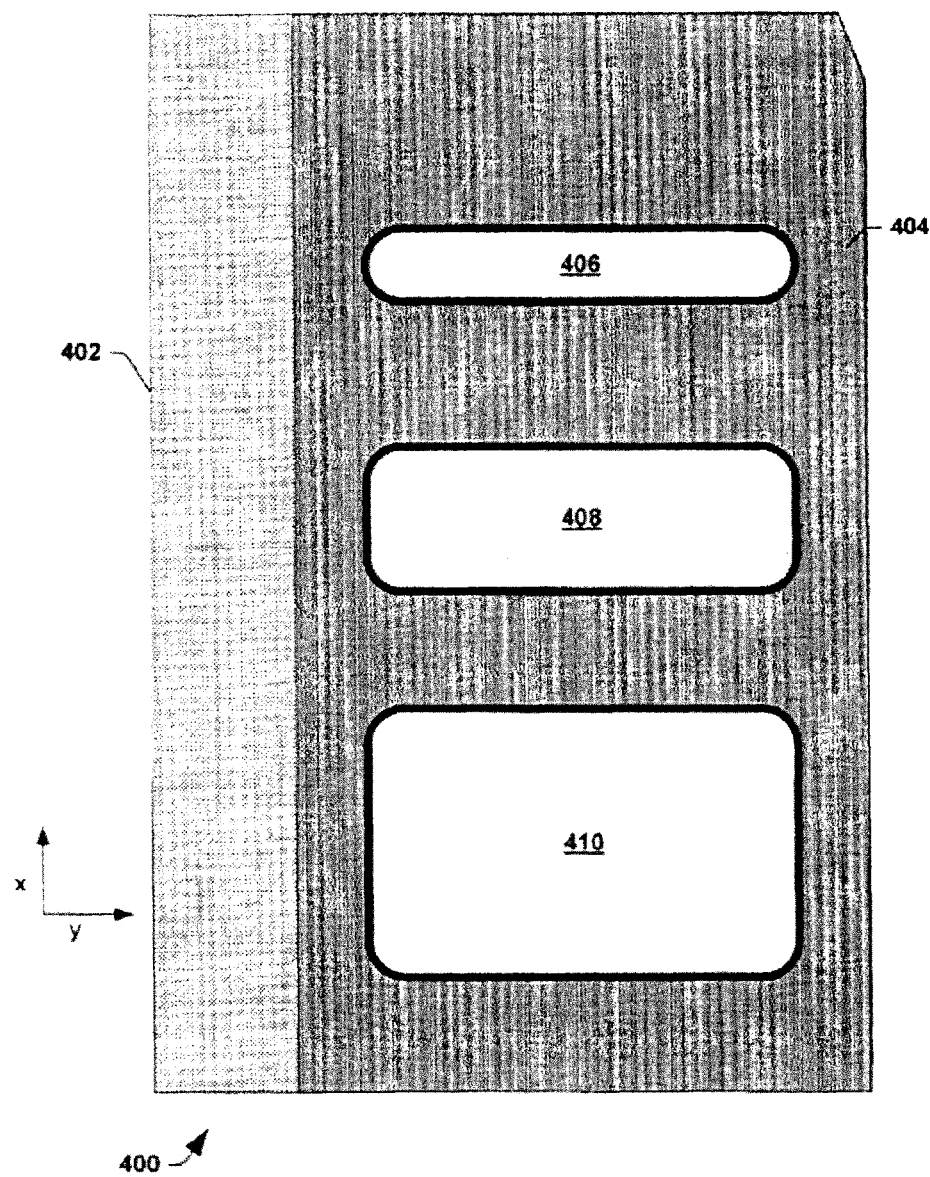
FIG. 2 is reproduced from U.S. Pat. No. 7,399,980 B2 and is prior art of a mass resolving aperture that can provide subsystems for embodiments of the subject invention and/or can be modified in accordance with embodiments of the subject invention.

FIG. 2, which is FIG. 4 of U.S. Pat. No. 7,399,980 reproduced here as existing art, shows an example of a prior art mass resolving aperture. Embodiments of the subject MRA can involve modification of the MRA of FIG. 2 to incorporate a fin positioned proximate the aperture through which the ion beam passes. Such a fin can have a leading portion closest to the oncoming ion beam and, in specific embodiments, a surface that curves from the leading portion to form a convex surface adjacent to the leading portion to deflect ions halting such convex portion out of the ion beam. Such a fin can also have two or more segments (e.g., each segment of the volume of the fin) that have electric charge and/or magnetic properties. Such fins can be located on along a portion of or the entire edge of the sides establishing the width of the ion beam, and/or along portions or all of edges of the top and bottom sides establishing the height of the ion beam. Embodiments of such a plate can have one, two, three or more openings, each having desired dimensions, such as height and width. Embodiments of a modification of the resolving aperture assembly 400 can have an assembly arm 402 that holds resolving plate 404 that has one or more opening (1, 2, 3, 4 . . . n), such as three resolving apertures 406, 408, and 410. Embodiments can allow the assembly to be moved, e.g., via actuators, so the selected aperture corresponds to a selected beam envelope and/or selective mass resolution. The assembly can also move to accommodate varied beam paths corresponding to a range of possible angle adjustments of the mass analyzer, upstream (not shown). Because the 1st, 2nd, and 3rd positions of aperture openings are alongside during operation, some materials or portions of the beam may pass through one of the non-selected apertures.

Figure 3A:
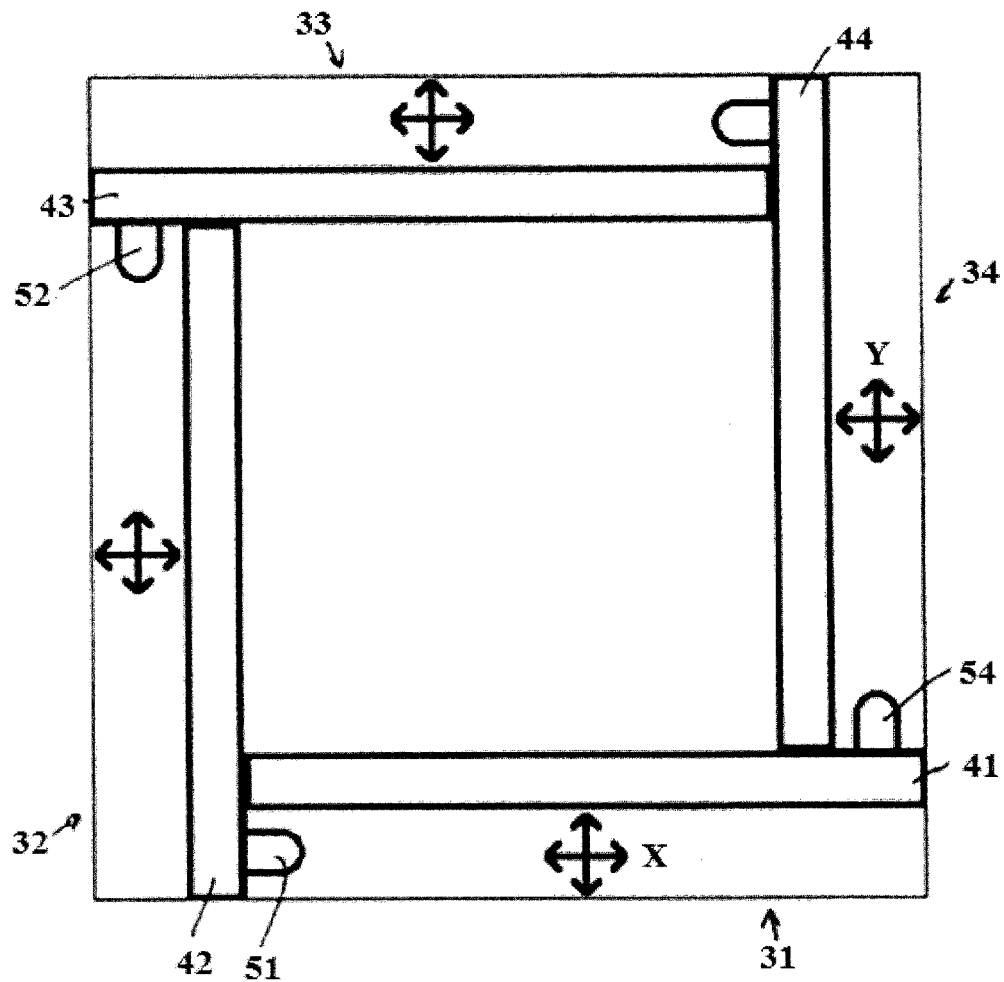
FIG. 3A is an exemplary embodiment of the present invention showing a mass resolving aperture with sliding sides that allow the aperture to be moved incrementally to any height or width compared to the ion beam envelope.

FIG. 3A shows an embodiment of a mass resolving aperture assembly 30. The aperture opening position in FIG. 3A generally corresponds to the aperture opening 410 shown in FIG. 2 (in the plane of the page). The assembly includes sides 31, 32, 33, and 34, where the sides slide in the X and Y directions to create a variety of opening sizes and positions. The sides are shown having the same width and having a length that does not extend far enough back from the edge of the side to block the portion of the opening the side was blocking in FIG. 3A once the sides are moved to the position shown in FIG. 3C, which has been done for convenience of drawing such that a range of motion of the sides can be emphasized. A variety of mechanisms, such as gears, tracks, linkages, actuators, and motors, can be used to control the movement of the sides. The sides 31, 32, 33, and 34 slide along aperture inside edges 41, 42, 43 and 44, respectively. The aperture sides 31-34 can slide relative to a back plate having an opening that allows the aperture opening to be adjusted to any opening size within the operating range of sides 31-34.

Figure 3B:
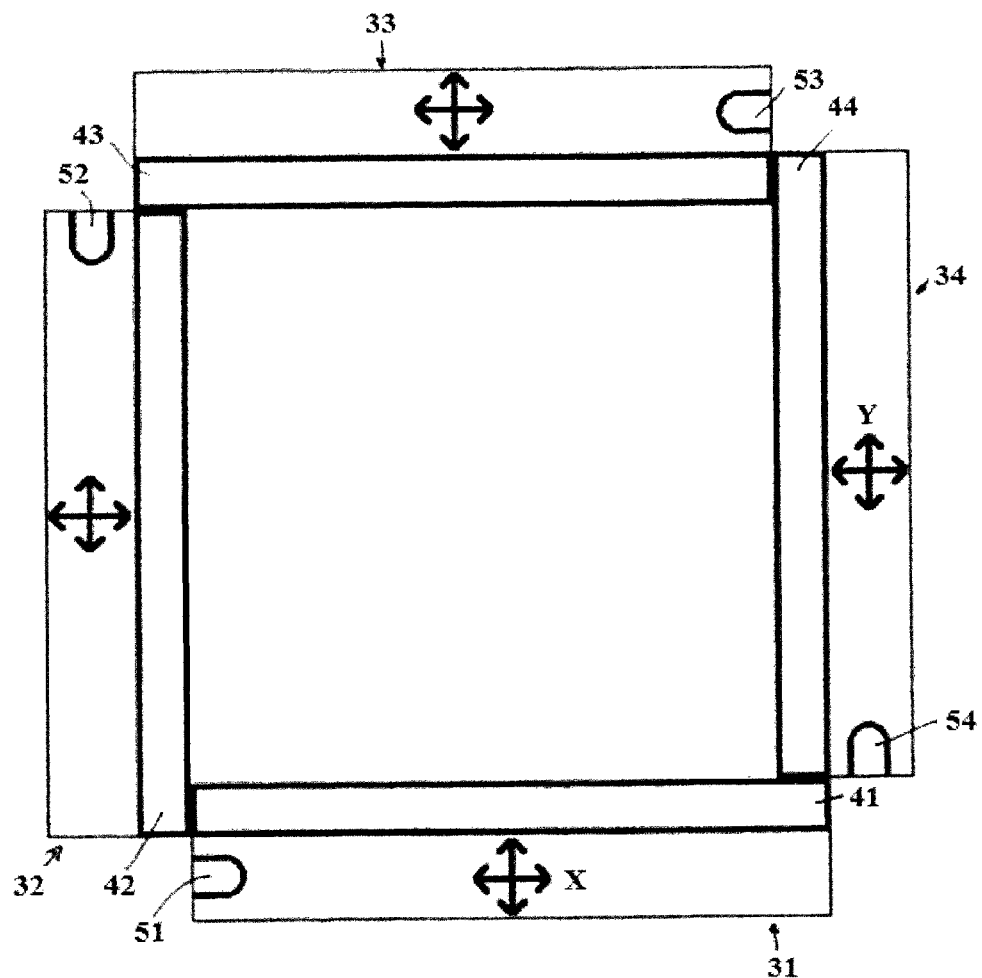
FIG. 3B shows the mass resolving aperture of FIG. 3A fully open.

FIG. 3B shows the sides 31-34 moved to a maximum opening aperture within the operating range and can correspond to the size and location of the opening of a back plate. Such a back plate can be used as a mount for the interconnection of the sides to the structure for moving the sides. This opening can exceed the beam envelope emerging from the mass analyzer 310 such that the MRA can be "removed" from the beam path by opening the sides to this maximum opening. The use of the maximum opening prior to implantation can be useful for beam diagnostics downstream of the mass resolving aperture. This maximum opening setting could also be used for certain cleaning techniques where an ion beam or other gases are proliferated through the system downstream of the mass resolving plate.

Figure 3C:
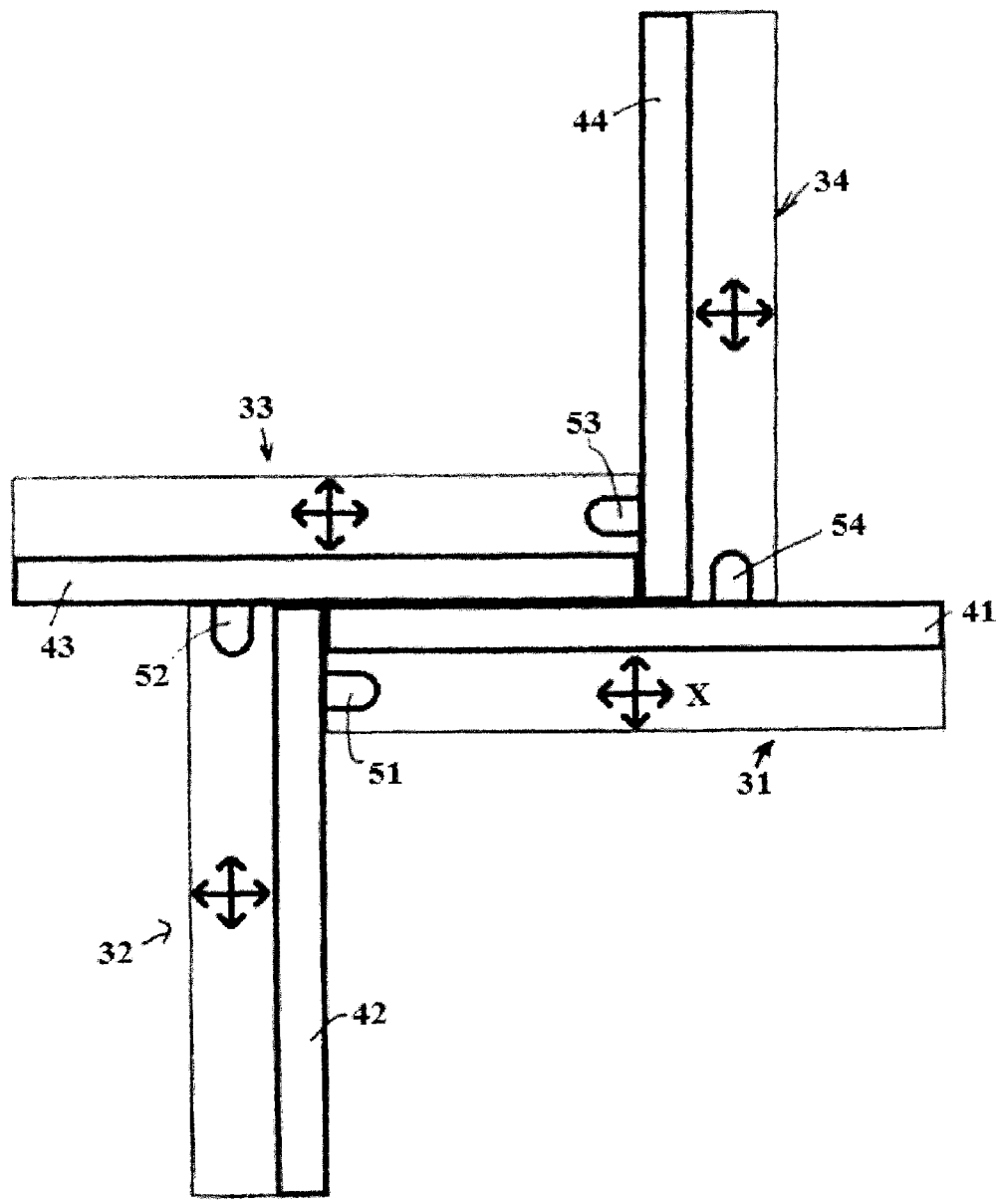
FIG. 3C shows the mass resolving aperture of FIG. 3A fully closed.

FIG. 3C shows sides 31-34 moved so the aperture is fully closed. This setting blocks the ion beam and can be used for a beam dump where the magnetic field is still operable in the mass analyzer 310. This setting could also be used for certain cleaning techniques where the ion beam or other gases are proliferating through the system, upstream and including the mass resolution aperture. As can be seen in FIG. 3C, for an embodiment having all four sides movable in the X and Y directions, and optionally the Z direction, a variety of locations for the four sides can create a closed position. In an embodiment, the fully closed position completely blocks the ion-beam.

Other positions of the sides can be selected. Any position for the aperture opening, e.g., for the location of a center of the opening or for the corners of the opening, within the operating range can be selected. Also, the assembly 30 with back plate, the assembly 30 without the back plate, and/or the assembly, back plate and other structure, can be moved, optionally, from side to side (X axis), up or down (Y axis), forward or back (Z axis), within the range of operation, to adjust the opening relative to the ion beam 309.

The mass resolving aperture assembly 30 can be operatively coupled to power supplies 340, 339. A control system 337 can be used to control, adjust, and/or communicate with the ion source 302, the mass analyzer 313, the mass resolving aperture assembly 30, the scanning element 322, the parallelizer 329, and the beam profiling system 331 and/or other operable aspect of the device. Beam diagnosis system 338 can be connected to the control system 337 to allow for iterative changes within the system to manage the beam characteristics before, during, and/or after the implantation process. So that, for example, the control system 337 may set the mass resolving aperture sides 31-34 at the full open aperture FIG. 3B, prior to rotating the workpiece 335 into the system end station 336, so that, for example, beam diagnosis is completed and parameters are set. Once the beam parameters are set, control system 337 can move sides 31-34 to any desired aperture opening matching the desired parameters in order to, for example, start, modify, and/or terminate the implantation process. Then, during the implantation process, for example, the control system 337 may use data from the beam diagnosis 338 system to move the mass resolving aperture assembly 30 or sides 31-34 incrementally, to manage and/or optimize the beam characteristics. After the implantation process or during the time that a new workpiece (not shown) is rotated into the end station 336, for example, the control system 337 could move sides 31-34 into the fully closed position FIG. 3C, for cleaning processes or other purposes. The control system 337 would be able to move sides 31-34 to the full closed position, FIG. 3C for a beam dump, while the magnetic fields in the mass analyzer are operative. Functions of the mass resolving aperture assembly 30 can be performed iteratively, in real time. Embodiments of the subject MRA can modify a conventional mass resolving aperture, an example of which is shown in FIG. 2, by incorporating curved inside edges, e.g., fins, on one or more sides, or sections of the side, of each opening or for a subset of the openings. Curved surfaces, as illustrated and described herein, may be used for the aperture inside edges, in an exemplary embodiment of the invention. Curved surfaces, as herein described, may be used as the inside edge for any convention mass resolving aperture, including prior art, for example as illustrated in FIG. 2. As the ion beam 309 reaches the mass resolving aperture assembly (314 in prior art system shown in FIG. 2), it is still traveling at relatively high energy to mitigate the propensity for space charge blow up. Deceleration stages 327 are downstream from the aperture, so the excluded ion species are hitting the leading edge of the mass resolving aperture at relatively high velocities with a tendency to sputter contaminants, including preexisting residue, into the ion beam; said contaminants may be entrained into the beam and find their way to the workpiece 335. This is particularly evident in high beam current, cluster molecule of heavier mass, multiple ion source and ion sources with narrow range of mass dispersion. Curved surfaces have the advantage over other surfaces of presenting less surface to strike at the point of exclusion and the excluded ion species do not impact a curved surface flush and when they do deflect, the continuing ion beam has already moved downstream, so the possibility of having contaminates from the excluded ion species being entrained to contaminate the workpiece is reduced. The residue from the excluded ion species may build up on the mass resolving aperture, during the implantation run time, but it is well away from the aperture opening and behind the curved edge of the mass resolving aperture. Curved surfaces, as herein described, could be used on other surfaces within the system, where excluded ion species, excluded neutrally charged or negatively charged particles or contaminants from upstream system part wear down, strike a surface. Excluding contaminants from reentering the production line anywhere upstream from the workpiece 335, in the manner herein disclosed, will contribute to the quality and efficiency of production.

Figure 5A:
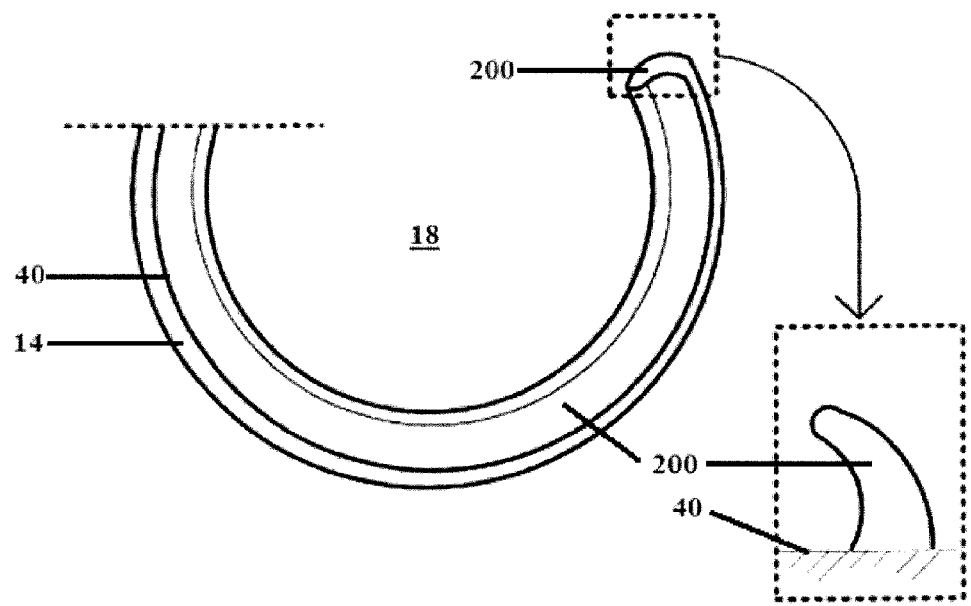
FIG. 5A shows a cross-sectional view showing a fin in accordance with an embodiment of the invention.
Figure 5B:
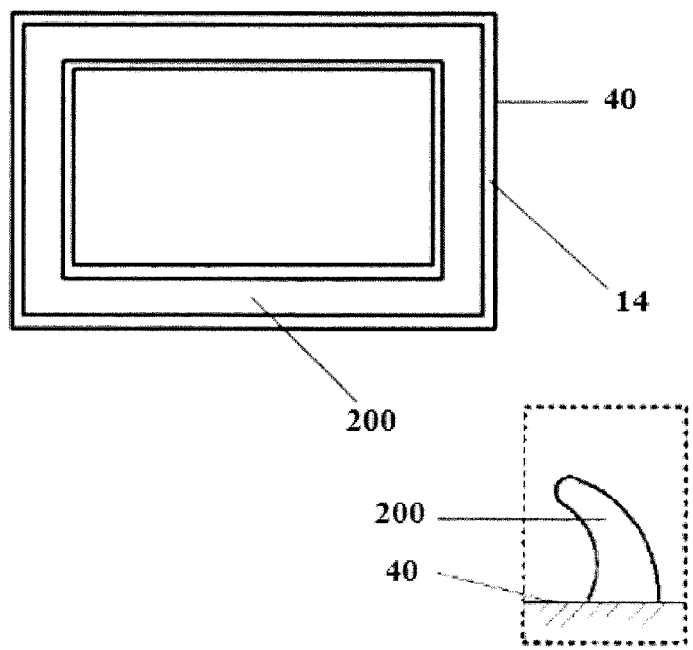
FIG. 5B illustrates a curved edge that may be used as the inside edge of the mass resolving aperture.

FIG. 5B shows a rectangle shaped mass resolving aperture, with a single aperture opening, rather than the ring shape shown in FIG. 5A. Along a side wall 14 within new surface 40 is shown in FIGS. 5A and 5B. Although FIGS. 5A and 5B show a side wall 14, this side wall can be thickened such that the side wall becomes a plate, such as shown in FIG. 2, and the Figure then represents a fin extending from the plate. Fin detail 200 is shown in both FIGS. 5A and 5A. In an exemplary embodiment of the present invention, a conventional mass resolving aperture is modified to incorporate a curved edge, as herein disclosed, instead of a flat or flush edge and instead of a 90° edge from front to back (i.e., parallel to Z-axis). Modification of any conventional mass resolving aperture, as herein disclosed, to have a curved surface on the aperture's inside edge facing the incoming ion beam 309 will mitigate sputtering of incorrect ion species and deposit residue, contaminants, behind the curve which, otherwise, may be entrained in the beam and contaminate the workpiece 335. During the run, the residue build up, is contained downstream from the aperture opening, further mitigating against residue coming loose and finding its way into beam.

Figure 8A:
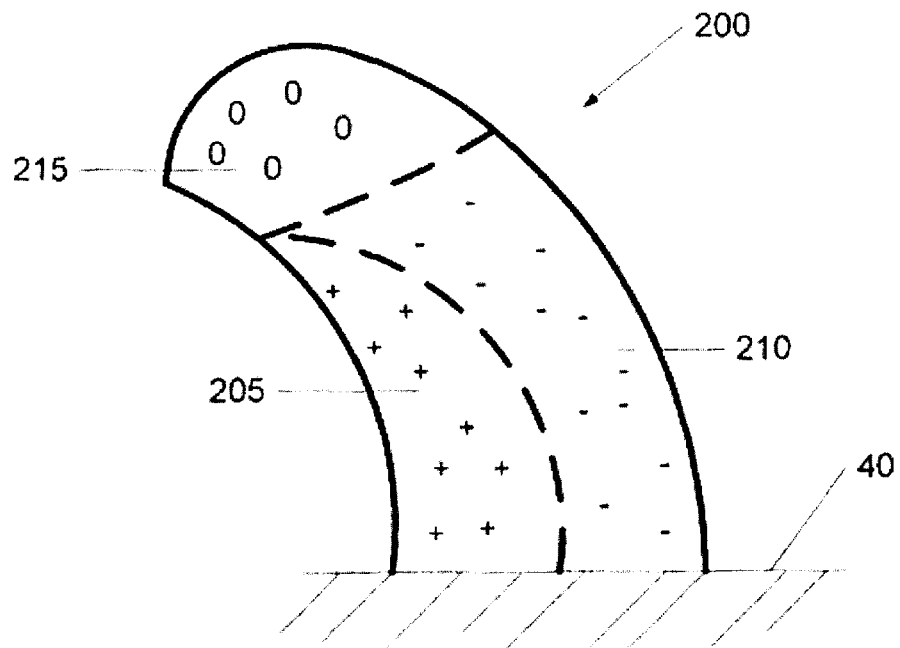
FIG. 8A shows a cross section of a curved surface, or "fin", in accordance with an embodiment of the invention.
Figure 8B:
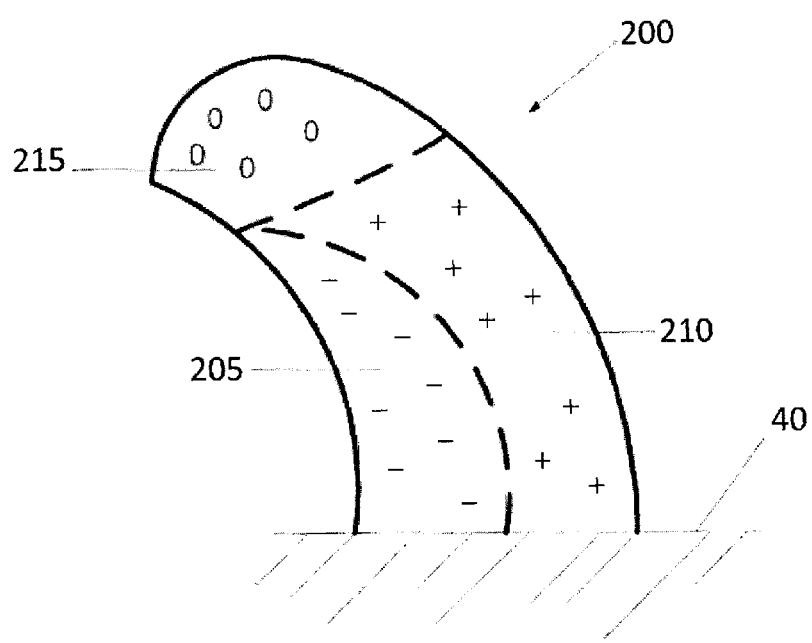
FIG. 8B shows a cross section of a curved surface, or "fin", in accordance with an embodiment of the invention.

FIGS. 8A and 8B show embodiments of fins that can be incorporated with an MRA. Although surface 40 of sidewall 14 is shown in FIGS. 5A and 5B as extending past the front surface (facing an oncoming beam) and extending past the back surface (facing away from oncoming beam), again the sidewall surface 40 can be thickened to perform as a plate, and sidewall surface 40 can extend from the front surface to beyond the back surface, from the from surface to the back surface, or extend in any other desired orientation to the front and back surfaces. Region 205 can have a positive, negative, or neutral charge. Region 210 can have a positive, negative, or neutral charge, as can region 215. The charged regions can be used to exclude charged ion species of incorrect mass. Embodiments can be segmented in different manners, including dimensions, number of regions, and/or shapes of the regions. As may be appreciated, any number of segments can be employed for beneficial reasons. For sake of simplicity, in this embodiment, three segments are shown 205, 210 and 215. Also, as may be appreciated, there are any number of curved surfaces that may be employed for beneficial reasons. As used here, this shape is not intended to be a limiting depiction, just one used for the sake of simplicity. The segments 205, 210 and 215 preferably, may be insulated electrically from each other and isolated magnetically as well, so that each may carry a different charge/field negative or positive, that is electrostatically beneficial and/or magnetically beneficial, or no charge at all. As shown in FIG. 8B, segment 205 is negatively charge/field, segment 210 is positively charged, and segment 215 has no charge, by way of example.

In reference to the ion beam 309, as ion beam 309 reaches segment 215, segment 215 has no charge, segment 205 has enough negative charge/field to attract positive ion species that are close to the desired charge to mass ratio, but not quite in the parameters, and those ion species move in the direction of segment 205 and tend to stick, with reduced sputtering because of the attractive negative charge/field. In this same example, for the positive ion species that strike the surface of segment 215, the exclusion point of the aperture, they are deflected out of the ion beam because of the curved surface. Continuing with this example, the ion beam, now passing segment 215, at this point, as will be further disclosed, segment 210 may influence the ion beam 309, beneficially, by having the capability to impart a positive charge/field, a negative charge/field or no charge. It may be appreciated, that each segment of the mass resolving aperture, as presently disclosed, may be utilized independently and in a variety of different combinations. For example, if negative ion species were extracted instead of positive ion species, then the segment charges, of the mass resolving aperture, as herein disclosed, would be changed to correspond to the implant parameters of negative ion implantation. Or for example, if boron hydride cluster ions or germanium ion species are used, the mass resolving aperture, as herein disclosed, offers the control system and the controller, tunable options, beneficial to production.

Although not illustrated in a figure, a MRA having a 90° edge around the opening can be segmented into charge/magnet field segments. In a specific embodiment, a segment of face surface of the aperture, proximate the opening, but sufficiently away from the opening to not influence ions that should pass through the opening can have an electric charge that attracts the ions that should be excluded and that are likely to hit the edge and possibly get deflected back into the beam.

A variety of fin shapes can be used with respect to various embodiments. In a specific embodiment, a fin having a curved surface that starts at the edge and cures into the ion beam can be used.

Figure 4A:
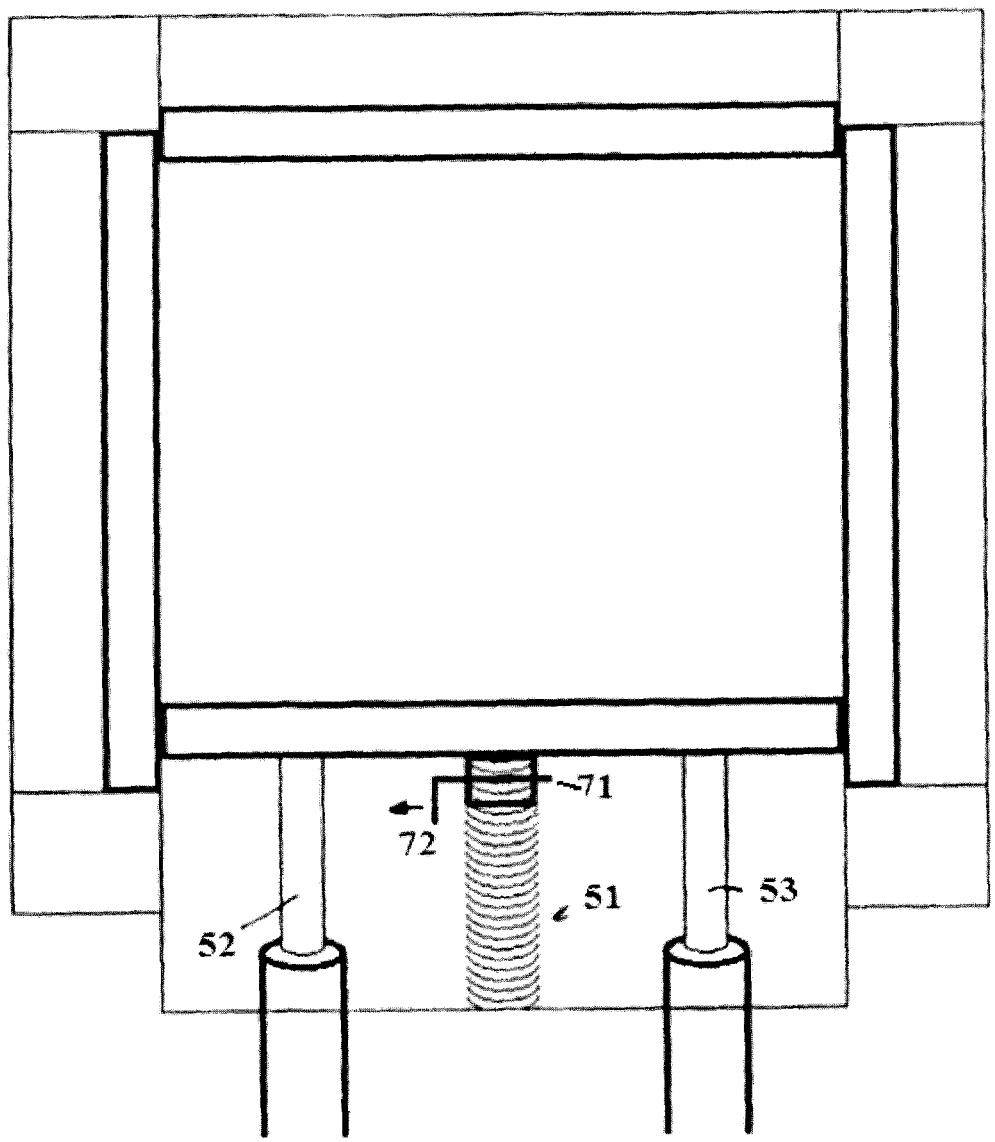
FIG. 4A shows a specific embodiment of the subject invention, incorporating a screw drive and two pneumatic drives.
Figure 4B:
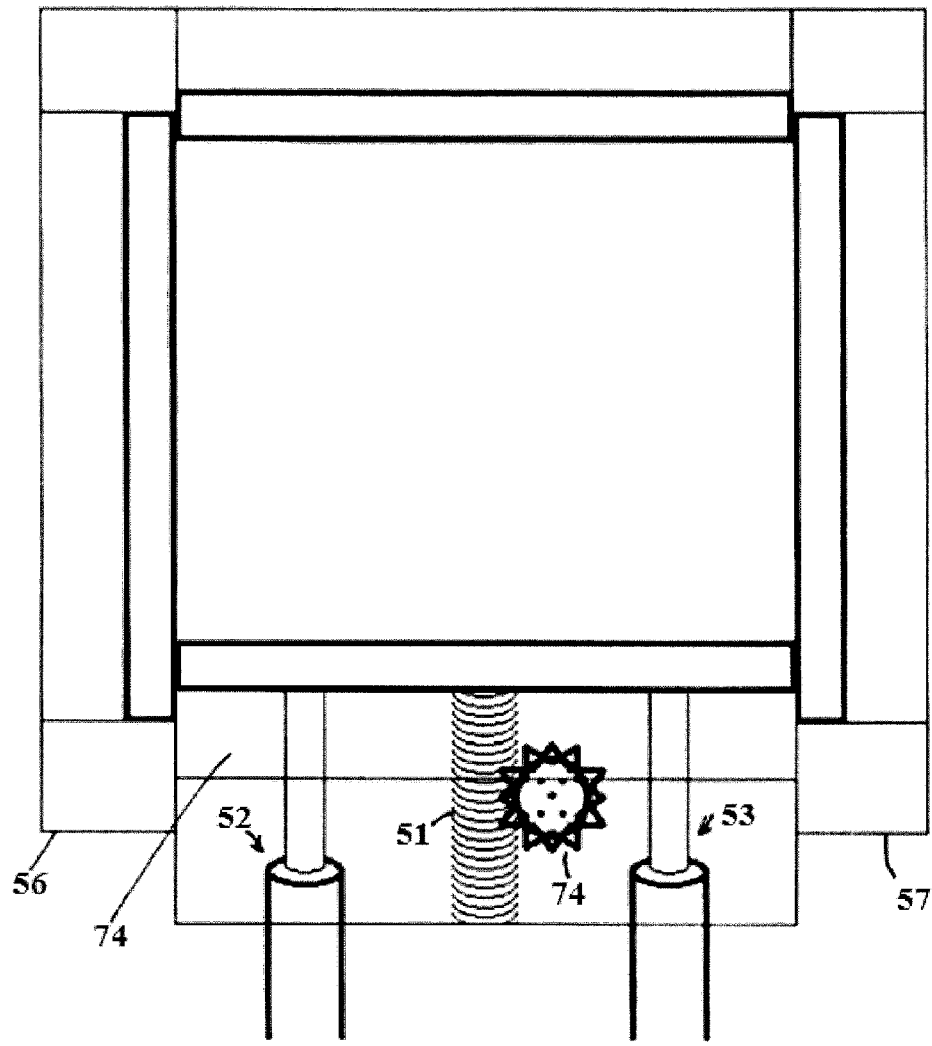
FIG. 4B shows a specific embodiment of the subject invention incorporating a screw drive and a gear.

Although FIGS. 4A and 4B show a movable side on the bottom of the figure and three sides that can be fixed together on the top, embodiments in accordance with the teaching of FIGS. 4A and 4B can be used for moving a side in a vertical direction, or moving a side in a horizontal direction. The three sides can be fixed together and move as a unit, or a base that all four sides are connected to can be moved. Moving of the unit and the individual side can be useful for adjusting the center of the opening with respect to the ion beam, when the fourth side is moved to adjust the height, or adjust the width, of the ion beam.

Figure 6:
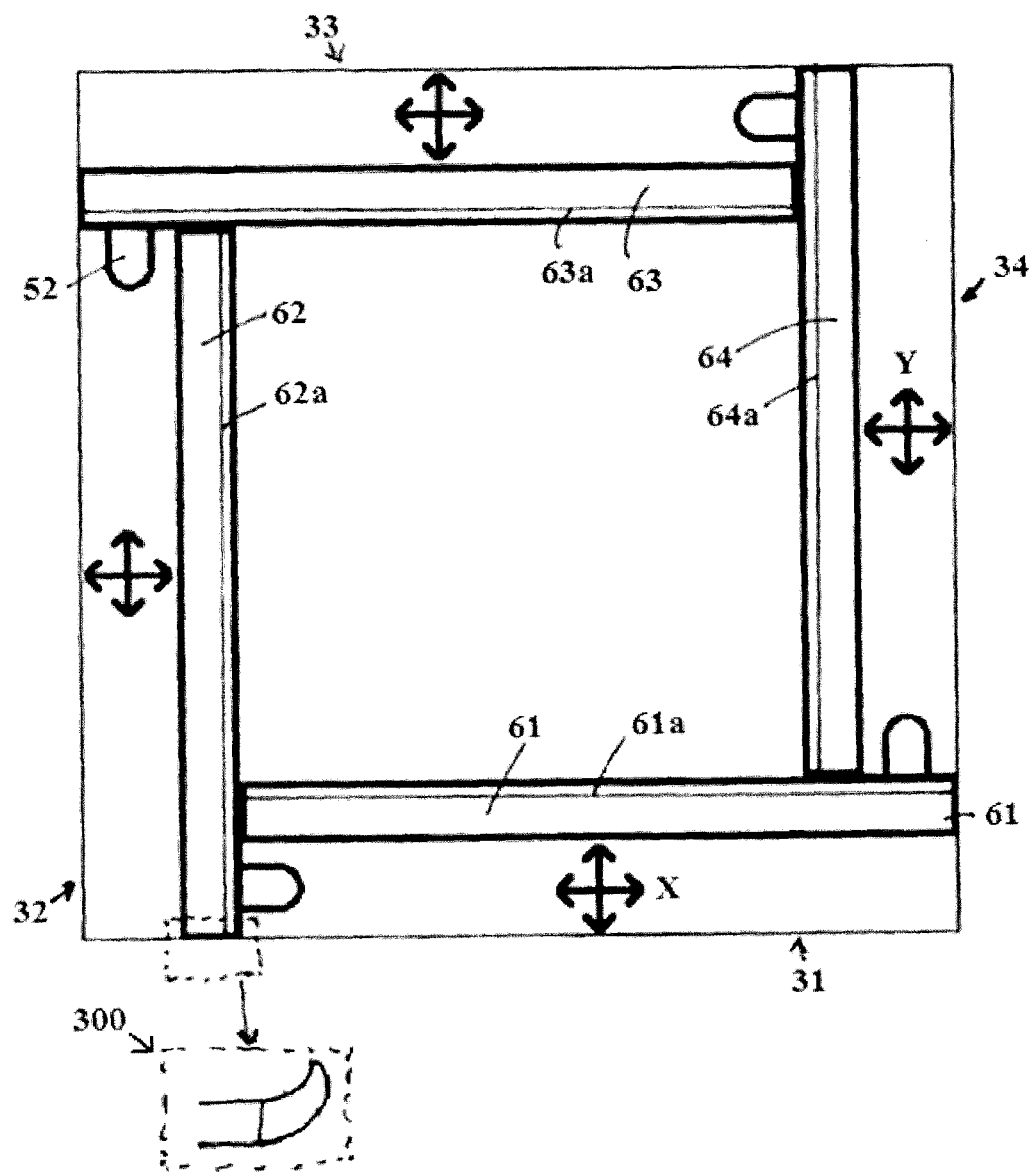
FIG. 6 illustrates an embodiment of a MRA incorporating a curved inside edge, together with sliding sides.

FIG. 6 is a further exemplary embodiment of the present invention, illustrating the use of independently movable sides of the mass resolving aperture assembly 30, where the fin surfaces, as previously describe in FIGS. 5A-B and 8A-C, are shown as the leading edge of the sliding sides 31-34, replacing 41-44 with fin edges 61-64, respectively. In this exemplary embodiment, the leading edges of the adjustable mass resolving plate assemble 30, described in FIGS. 3A-C are fin edges 61-64. The operating range of movement for the mass resolving aperture 30 is side to side on the X axis, in and out on Z axis, up and down on the Y axis within the operating space. A further embodiment only allows motion in the X and Y direction. The movements of mass resolving aperture 30 along the X, Y and Z axis are controlled by the control system 337 and/or the controller, in operable communication with the beam diagnosis center 155. Sliding sides 31-34, with fin edges 61-64, in operable communication with control system 337 and/or controller, receiving operable data from beam diagnosis system 338, have the capability to be incrementally moved from fully open, FIG. 3B, to fully closed, FIG. 3C or any opening in between fully open and fully closed, in real time.

Embodiments of the subject invention can utilize a method and apparatus for the separation of ions by mass using permanent magnets to produce a uniform magnetic field within a cavity. This is achieved by the creation of a preferably low density plasma within a confined space via photoionization of a plasma precursor gas or vapor under vacuum. Segregation by mass, or mass-to-charge ratio, occurs because ions with greater mass, or higher mass-to-charge ratio, are not as influenced by the magnetic field and tend to separate from the lighter ions, or ions with a lower mass-to-charge ratio.

With reference first being made to FIG. 1B, there is illustrated a side sectional schematic view of the subject closed plasma channel apparatus (hereinafter sometimes also referred to more simply as the "subject apparatus"), designated generally by reference numeral 10. A first primary component of apparatus 10 is an ionization chamber 12 (also referred to herein in some embodiments as a "plasma separation chamber") comprising an ionization vessel (also referred to herein in some embodiments as a "plasma separation vessel") having an ionization space (also referred to herein in some embodiments as a "plasma separation space"). In a preferred embodiment, ionization chamber 12 is comprised of a semi-flexible, elongated vacuum conduit having a first end portion 12A and second end portion 12B, the conduit comprising a hollow cylindrical wall 14 having a longitudinal axis 16 and defining a transmission space 18 for containing a plasma precursor gas or vapor 100 supplied via inlet 20 from storage container 22. The terms "chamber" and "conduit" are hereinafter used interchangeably unless specifically distinguished. A vacuum system 24 is operably attached to conduit 12 for the evacuation of air from transmission space 18 through outlet 26 disposed through wall 14. Conduit 12 may be constructed of a plurality of separate parts which are coupled together to define transmission space 18, or may be of unibody construction. The cross-sectional shape of conduit 12 and transmission space 14 may be round, oval, polygonal or otherwise and is selected based on the efficiency with which energy is transmitted through the system as determined through experimentation.

Ionization means are provided for ionizing plasma precursor gas 100 inside conduit 12. It should be immediately recognized, however, that ionization of plasma precursor gas 100 may also be carried out in a separate chamber and then transferred into transmission space 18. Notwithstanding this option, ionization within conduit 12 is preferred to cope with recombination of charged particles on an ongoing basis. It is expected that there may be some recombination back to the gas or vapor state which is undesirable; plasma precursor gases universally conform to the Bose Einstein principle of being a conductor in the ion state and an insulator in the gas state. Ionization by means of ultra-violet light, X-rays, radioactive rays, glowing metals, burning gas, and electronic collision are all contemplated although the former means is preferred.

It is recognized that a laser beam of suitable wavelength can penetrate and ionize a gas or vapor medium over great distances. Accordingly, an ionizing beam emitting means 28 is provided for emitting ionizing beam 30 ("laser beam") into transmission space 18 which has been charged with plasma precursor gas 100. The term "ionizing beam emitting means" as used herein includes not only presently known lasers and laser diodes, but also other light sources of high steradiancy which will excite ionization in a medium. Lasers utilize the natural oscillations of atoms or molecules between energy levels for generating a beam of highly amplified and coherent electromagnetic radiation of one or more discrete frequencies. The laser means used to ionize plasma precursor gas 100 should be selected with regard to energy, pulsewidth and wavelength. Transmission space 18 must be clean, dry and scrubbed of any catalytic agents or impurities that would impede full ionization of plasma precursor gas 100.

A parcel mirror 32 is mounted across the opening of first end portion 12A of conduit 12 and solid reflective mirror 34 is mounted across the opening of the opposite end portion 12B. Parcel mirror 32 and solid mirror 34 have reflective surfaces 36 and 38, respectively, facing transmission space 18. Parcel mirror 32 permits the passage of ionizing beam 30 generated by ionizing beam emitting means 28 into transmission space 18 conduit 12, but does not allow light to pass in the opposite direction, instead reflecting it back into reaction space 18. Reflection of ionizing beam 30 within transmission space 18 promotes uniform photoionization of plasma precursor gas 100.

In order to ensure uniform photoionization of plasma precursor gas 100 throughout transmission space 18 the inside surface 40 of wall 14 must be highly efficient in reflecting light particularly short wave light in the UV ranges. Alternatively, optical cavity or optical resonator technology may be employed and is comprised of an arrangement of mirrors that form a standing wave cavity resonator for light waves. Optical cavities are a major component of lasers, surrounding the gain medium and providing feedback of the laser light. Light confined in the cavity reflects multiple times producing standing waves for certain resonance frequencies.

Once the plasma precursor gas 100 is ionized to achieve the desired plasma density, the plasma components are substantially separated into regionalized channels running parallel to longitudinal axis 16 in response to a magnetic field applied within transmission space 18. Each channel is comprised primarily of a single plasma component (i.e., electron, ion or neutral particle) and is established along the entire length of transmission space 18, from first end portion 12A to second end portion 12B. One channel is comprised primarily of free-electrons (an "electron channel" or "electron path") and provides a path of least resistance for the transmission of energy therethrough. Several embodiments of magnetic field producing means are described below. Generally, a homogenous axial magnetic field is first established throughout the transmission space containing the ionized gas to separate the plasma into its ion, electron and neutral particle component parts, each component type occupying a substantially separate region parallel to longitudinal axis 16, each region having a different degree of conductivity. This process may be referred to as "stratification" of the plasma.

In a first embodiment, a magnetic field is created within transmission space 18 by conduit 12 itself, the cylindrical wall 14 of which is composed of an array of magnetic segments 42 with varying directions of magnetization 44 (i.e., a "Halbach cylinder") which produce a magnetic flux confined to the transmission space 18 of conduit 12. Those skilled in the art will recognize that the ratio of outer to inner radii of conduit 12 plays a critical role achieving the desired magnetic flux within transmission space 18, as does the number and direction of magnetization of each magnetized segment 42. Referring to FIG. 3, it may be observed that the direction of the magnetic field produced by a cylinder of the K=2 variety is uniformly bottom to top (transversely upward), as indicated by vector field arrow 46. A K-2 Halbach arrangement produces a uniform magnetic field. A variation of this arrangement is illustrated in FIG. 4 in which plurality of permanent magnets shaped into wedges 48 are organized into the desired hollow conduit 12. This arrangement, proposed by Abele and Jensen, also provides a uniform field within transmission space 18. The direction of magnetization of each wedge 48 is calculated using a set of rules given by Abele, and allows for great freedom in the shape of wall 14 and transmission space 18. Embodiments with non-uniform magnetic fields can also be used. Note that by varying the directions of magnetization 44 into different patterns the magnetic flux within transmission space 18 becomes more complex, as evidenced by vector field arrows 46. Such arrangements accordingly produce more complex arrangements of channels including, for instance, more than one channel of the same plasma component. Accordingly, more than one electron path may be generated within a single transmission space 18 with these arrangements.

In another design variation known as a "magnetic mangle", the magnetic field producing means is external to conduit 12 and in one embodiment is comprised of a plurality of uniformly magnetized rods 50 incrementally spaced around the circumference of conduit 12, parallel to its longitudinal axis 16. The rods possess different cross-sectional directions of magnetization 44 relative to one another to mimic the field producing effects of Halbach cylinders. As may be observed, the arrangement illustrated is closely related to the k=2 Halbach cylinder. Rotating rods 50 relative to each other results in many possibilities including a dynamically variable field and various dipolar configurations. Embodiments that provide magnetic field producing means external to conduit 12 have the advantage of permitting the conduit to be made of conductive or non-conductive materials. Semi-rigid polymers, ceramics and glass are contemplated.

In yet another embodiment, electromagnetic field producing means external to the conduit is comprised of at least one electromagnet arranged to impart an electromagnetic field within transmission space 18 for the segregation of plasma components into the desired longitudinal channels. A quadrupole electromagnet is illustrative but may not be ideal for conduits of lengths suitable for long distance power transmission.

Referring once again to FIG. 1B, once the "regionalizing" magnetic field is established within transmission space 18 and the plasma components are separated into axially aligned regions, a current "I" is drawn from power source 52 and passed through conduit 12, perpendicular to the magnetic field "B", creating an electromagnetic force "F" (Lorentz Force) which has both magnitude and direction. For simplicity's sake, the magnetic field "B" is shown between two permanent magnets 54A, 54B rather than the above described magnetic field producing means. The direction of force F is dictated by the directions of magnetic field 8 and current I according to Fleming's left hand rule. The application of the external electromagnetic force, Lorentz force, will stratify and substantially separate the plasma components from one another. Once separated, the applied electromotive force will exploit pathways of free electrons from point to point with little or no resistance. The plasma precursor gas or vapor 100 employed is paramagnetic and will either be attracted to or repelled from the electromagnetic field. The mass/charge ratio is different for the electrons, ions and neutral particles leading to either a greater or lesser attraction to the external field. Thus, each plasma component responds to the force with greater or lesser spatial displacement.

Embodiments can form a closed plasma conductor (CPC) with one or more mass separation filters for extracting undesirable ions. The fins of FIGS. 5A-B and 8A-8C can be used as a mass separation filter, where 40 represents the surface of the vessel in which the ion beam flows, and magnetic fields and/or electric fields can be used to control the motion of the ions in the beam such that the filter can remove undesirable ions. The fin can extend out from the surface and have a variety of paths, e.g., helical, circular (FIGS. 5A-5B), or other desired path.

Based on the Halbach magnetic arrangements already describe in the application, arrangements of the permanent magnets influence charged particles inside the CPC. Certain arrangements can attract different mass ions towards the walls of the chamber or repel towards the center. Where the undesirable ions have been attracted to move along the wall of the chamber, extraction can be accomplished with filters by the method herein described. Then in the next segment of the CPC, a different Halbach arrangement attracts ions of different mass to filters and so on, until only the needed ions (product) proceed.

Figure 8C:
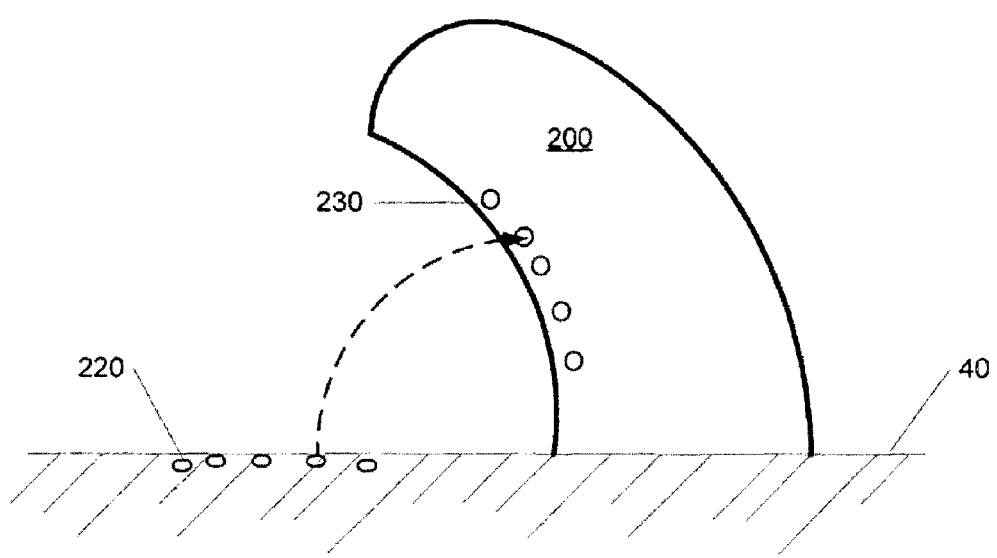
FIG. 8C shows a cross section of a curved surface, or "fin", in accordance with an embodiment of the invention.

Fin type mass separation filters have been added to the CPC. Dopants, donors, receivers, "gelters", can also be used in a manner described in a variation of embodiments. A preferred embodiment is a "fin" type filter made from a ferromagnetic material bound in formable material to shape fin type ion filter that rings the inside of the CPC as shown in FIGS. 8A-8C. A dopant may be applied. In a specific embodiment, the fin is also a Halbach magnet, meaning it is a composite of segmented pole placement of discrete magnetic fields to either enhance or cancel flux in a three dimensional plane.

Also the CPC can be adapted to use ionization produced in conventional manners. U.S. Pat. No. 5,189,303, Tanjyo et al. and U.S. Pat. No. 6,803,590, Brailove et al. teach such conventional ionization methods. Both Tanjyo and Brailove use a conventional ionization chamber. Tanjyo uses a filament to induce an arc discharge between the chamber and the filament; whereas Brailove uses RF antenna that ionizes electrons with a radio frequency device. Accordingly, the ionization production techniques of Tanjyo and Brailove can be implemented with the subject mass separation method.

Embodiments of the invention can separate ions by mass from ionized gas or vapor, eliminating undesirable ions from ions that become the product of the invention. Tanjyo (FIG. 21) uses a Wien Filter for mass separation and Brailove (FIGS. 22 & 23) uses a uniquely designed collimator walls where the magnetic field is tuned to emit the desired ions, while eliminating unnecessary ions of differentiated mass through collision with the collimator wall.

The present CPC invention, using the conventional set up described above i.e., Brailove, would consist of a conventional ionization source, conventional set of electrodes (except they would be tubular) and would replace the Wein filter, and the Brailove collimator wall with more than one novel feature.

A "fin" as taught throughout the subject application can be used as a mass separation filter by modifying a conventional CPC design by placing the "fin" after the plasma electrode and prior to the acceleration and ground electrodes. The "fin" filter can incorporate a cylindrical shelf or basin inside the CPC itself. This measurement of the distance that it extends into the CPC exactly matches the spatial segregation of the undesirable ions from the product ions taken into account the measured present nature of the ionized gas or vapor and the Halbach array employed.

By way of example, if ions with the greatest mass are to be extracted, the Halbach array is assembled to attract ions of that mass to the walls of the chamber and the "fin" would be set at the same distance as that mass volume population would occupy.

In an embodiment, in the CPC "fin", after passing the first filter, the next section of the CPC can be assembled with a different Halbach configuration attracting a different ion to the wall of the chamber and an additional properly measured filter to extract ions set at that position. And so on.

It is understood the concept of the "fin" filter can take on any number of shapes, a preferred embodiment is explained here. For the purpose of the CPC we will label this the "fin" filter because it resembles (in cross section) the dorsal fin of a dolphin if the dolphin was swimming the same direction as the ion flow. So that places the posterior of the fin towards the ion beam forming a cup with the wall of the CPC. The dorsal part of the fin is closest to the center of the CPC and the anterior of the fin drain is downstream.

It is understood that looking at a cross-section of this fin drain design that the fin can be divided into any number of parts. In a preferred embodiment the fin is divided into three sections, posterior, dorsal, and anterior.

The "fin" can be fabricated with ferromagnetic material in a binder, and possible dopant. The ferromagnetic material can be magnetized in its own Halbach array, independent from the walls of the CPC, except that the flux is arranged on the side desired and canceled on the side where a stray field is undesirable. Various permutations can be implemented. In a preferred embodiment, the "fin" magnetic field can be described in three sections and three corresponding magnetic fields. Fin charge/polarity may be in addition to the CPC magnetic field or also canceled to the same degree. The fin can be used to either carry charge or polarity in any combination.

In one embodiment, the posterior section of the fin is a positive field that adds to the CPC. The dorsal has no charge, meaning the posterior and anterior have been arranged to cancel the dorsal side. The anterior section of the fin has a negative charge. Any number of charge or polarity configurations can be designed into the fin, fine tuning against the background CPC magnetic field to produce the optimum solution for extraction.

The filter can extract the undesirable ions by means of a slit, grate, or holes. Ions will have circular motion in a unified magnetic field. In a preferred embodiment, holes are used spaced all the way to the lowest point of the posterior section of the fin drain and out to and onto the dorsal section of the fin drain. Not only are the holes sized to accommodate extraction of the undesirable ions, pattern size and shape are calculated to prefer the mass and circular motion of ions selectively eliminated.

Additionally the holes themselves can be enhanced with Halbach magnetic small flux field using the ferromagnetic composites, inside the hole, making the hole itself more attractive to the ion to be extracted.

In a further embodiment prior to the fin drain, perforations in the skin of the inside walls of the CPC can be closed, opened, periodically or continuously to release "getters" that move into the drain and are likewise extracted.

The present invention seeks to introduce optimum tunable variables to meet the requirements of the product ion.

An embodiment of the invention relates to a mass separation filter for extracting desirable, or undesirable ions. Embodiments incorporate at least one annular fin 200 for extraction of select ions that projects from the inside surface 40 of the wall 14 for extraction of select ions. A fin may be located at any point along the length of the ionization chamber between the plasma electrode at the first end and the acceleration and/or ground electrode at the second end. In the embodiments shown in FIGS. 8A-8C, the fin 200 has a particular cross-sectional shape in which it curves into the direction of the first end 12A of the conduit 12. Other fin cross-sectional shapes include a block-shaped fin, a fin with a sharper angle of attack into the direction of the first end 12A, and a cantilever-style fin. However, this list is not exhaustive, and other fin cross-sections that are apparent to a person with skill in the art and having benefit of the subject disclosure are considered.

Figure 7:
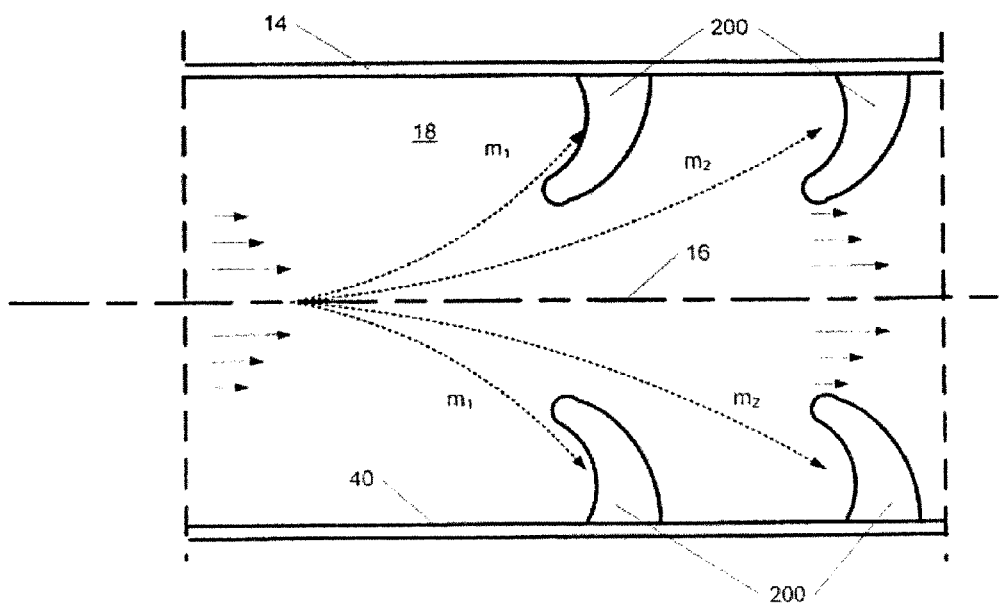
FIG. 7 shows a longitudinal cross-section of an embodiment incorporating the curved edge of FIG. 5A and/or FIG. 5B.

FIG. 5A shows a partial radial cross-section of an embodiment at a point along the length of the ionization chamber where there is a fin. FIG. 7 shows a partial longitudinal cross-section of an embodiment having at least two fins; particles $m_1$ and $m_2$ differ in mass and are thus affected differently by the magnetic field. This allows for collection of ions of varying masses at various points along the length of the ionization chamber. In a further embodiment, the number of fins and/or the length of the ionization chamber is such that only ions of a desired (or undesired) mass remain in the plasma by the time it reaches the second end 12B of the conduit 12.

The fins can capture ions in a variety of ways. In an embodiment, the fin is magnetized in its own Halbach array, independent from the walls of the CPC. In an embodiment shown in FIG. 8A, the fin has a positive polarity region 205 on the portion facing the first end 12A of the conduit 12, a negatively polarity region 210 on the portion facing the second end 12B of the conduit 12, and a non-magnetized region 215 on the portion of the fin that is closest to the longitudinal axis 16. In other embodiments, the positive, negative, and non-magnetized portions are distributed differently, or are not all present.

In an embodiment, the fin is fabricated by introducing a magnetic material into a substrate material. In a further embodiment, the material is a ferromagnetic material added into a polymer and either compression or injection molded into the desired fin shape. In a specific embodiment, the fin contains a neomagnet, such as $Nd_2Fe_{14}B$. In other embodiments, the fin may additionally contain one or several dopants, donors, receivers, and/or getters.

In an embodiment shown in FIG. 8C, there is a plurality of perforations 220 in the skin of the inside walls of the CPC that can be closed or opened periodically or continuously to release getters, which move toward the fin and are extracted. FIG. 8C also shows a plurality of holes 230 situated in the fin to accommodate extraction of ions. The pattern size and shape of the holes can be adjusted to prefer the mass and circular motion of ions selectively eliminated. Additionally, the holes can be enhanced with Halbach magnetic small flux fields using the ferromagnetic composite, making the hole itself attractive to the ion to be extracted. The energy to be transmitted may be introduced into the electron path directly via energy input means in operable communication with transmission space 18 at or near first end portion 12A. In a preferred embodiment, energy input means is comprised of a hyperbolic transmitting electrode 56 inserted into transmission space 18 at first end portion 12A of conduit 12 generally arid into that area of transmission space 18 occupied by the electron path in particular. Alternatively, when the electron path is adjacent at least a portion of wall 14 the energy may be introduced into the conductive wall 14 itself whereupon it will jump to the path of least resistance, that being the adjacent electron path. The energy to be transmitted is drawn from energy source 52. In one embodiment, energy source 52 may be a transformer or Cockcroft-Walton (CW, not to be confused with the acronym for "Continuous Wave") generator or "multiplier", which is basically a voltage multiplier that converts AC or pulsing DC electrical power from a low voltage level to a higher DC voltage level. It is made up of a voltage multiplier ladder network of capacitors and diodes to generate high voltages. Unlike transformers, this method eliminates the requirement for the heavy core and the bulk of insulation/potting required. Using only capacitors and diodes, these voltage multipliers can step up relatively low voltages to extremely high values, while at the same time being far lighter and cheaper than transformers. The biggest advantage of such circuits is that the voltage across each stage of the cascade is equal to only twice the peak input voltage, so it has the advantage of requiring relatively low cost components and being easy to insulate. One can also tap the output from any stage, like a multitapped transformer.

In operation, a clean, dry, airtight conduit is provided. The interior of conduit 12 must be scrubbed to eliminate any contaminants that might impede full ionization of the medium. Conduit 12 may be flushed with a so-called "getter" such as Cesium, to eliminate any catalyst. All fluid is evacuated from the transmission space 18 via vacuum system 24. Plasma precursor gas 100 is then extracted from storage unit 22 and introduced into conduit 12 via inlet 20 and pressure verified. A variety of plasma precursor gases or vapors may be employed. For instance, a titanium vapor is particularly well suited because it is an alkaline metal having only one valance electron and is therefore highly reactive. Lithium vapor may also be ideal. Ionizing beam emitting means 28 is activated to generate ionizing beam 30 and ionization is brought to maximum sustainable levels. Power is supplied to any magnetic field generating means that may require it for operation (such as electromagnetic multi-poles, for instance). A potential is applied axially across the transmission space 18, orthogonal to the magnetic flux via transmitting electrode 56 and hyperbolic receiving electrode 58 the latter of which is located at second end 12B of conduit 12. The foci of hyperbolic transmitting and receiving electrodes 56 and 58, respectively, face one another. The ends of both electrodes are inserted into the transmission space 18 a distance from first end 12A and second end 12B sufficient to account for any "end effects" affecting the uniformity of the magnetic field. Once the electromagnetic field is generated separation of the plasma into its component parts occurs producing spatially segregated channels of each component parallel to longitudinal axis 16. High order energy from power source 52 is then introduced into transmission space 18, again via transmitting electrode 56 and is transmitted through the transmission space along at least one segregated electron path having low or no resistance from point-to-point. The energy is received by receiving electrode 58 at end 12B of conduit 12 and in communication with energy recovery means 60 such as a capacitor bank, for instance. Conduit 12 is constantly monitored for leaks during operation.

Auxiliary systems for apparatus 10 are provided. The operation of apparatus 10 is monitored at two control panels located at the ends of the energy transmission line, to which all the required information is provided by probes for ionization levels, vacuum quality installed at several points along conduit 12. Suitable sites for the systems for monitoring, observing, and correcting plasma density will lie at junctions between sections. The system should be protected from extreme events, such as rupture of conduit 12 with loss of vacuum, for which fast vacuum gate valves should be installed at a certain distance along the conduit. For a gate valve response time of under 0:5 sec, and given the time to evacuate all of the energy from the line, the total energy loss should be minimal.

As should now be appreciated, the subject apparatus 10 is a room temperature conductor by design. Apparatus 10 serves as a means for transmitting high order energy from distant energy sources through a modified plasma containing conduit into a load center for further distribution. In the simplest terms, this invention is a bosonic energy carrier in a tube. Because both the magnetic field and the EM field configurations are nearly limitless and varying plasma mediums are conductive to a wide range of charged particles, motions through the tube can be manipulated in useful ways.

Aspects of the invention, such as controlling the opening and closing, moving, and adjusting the opening of the mass resolving aperture, as well as analyzing the beam downstream, may be described in the general context of computer-executable instructions, such as program modules, being executed by a computer. Generally, program modules include routines, programs, objects, components, data structures, etc., that perform particular tasks or implement particular abstract data types. Moreover, those skilled in the art will appreciate that the invention may be practiced with a variety of computer-system configurations, including multiprocessor systems, microprocessor-based or programmable-consumer electronics, minicomputers, mainframe computers, and the like. Any number of computer-systems and computer networks are acceptable for use with the present invention.

Specific hardware devices, programming languages, components, processes, protocols, and numerous details including operating environments and the like are set forth to provide a thorough understanding of the present invention. In other instances, structures, devices, and processes are shown in block-diagram form, rather than in detail, to avoid obscuring the present invention. But an ordinary-skilled artisan would understand that the present invention may be practiced without these specific details. Computer systems, servers, work stations, and other machines may be connected to one another across a communication medium including, for example, a network or networks.

As one skilled in the art will appreciate, embodiments of the present invention may be embodied as, among other things: a method, system, or computer-program product. Accordingly, the embodiments may take the form of a hardware embodiment, a software embodiment, or an embodiment combining software and hardware. In an embodiment, the present invention takes the form of a computer-program product that includes computer-useable instructions embodied on one or more computer-readable media.

Computer-readable media include both volatile and non-volatile media, transient and non-transient media, removable and nonremovable media, and contemplate media readable by a database, a switch, and various other network devices. By way of example, and not limitation, computer-readable media comprise media implemented in any method or technology for storing information. Examples of stored information include computer-useable instructions, data structures, program modules, and other data representations. Media examples include, but are not limited to, information-delivery media, RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data momentarily, temporarily, or permanently.

The invention may be practiced in distributed-computing environments where tasks are performed by remote-processing devices that are linked through a communications network. In a distributed-computing environment, program modules may be located in both local and remote computer-storage media including memory storage devices. The computer-useable instructions form an interface to allow a computer to react according to a source of input. The instructions cooperate with other code segments to initiate a variety of tasks in response to data received in conjunction with the source of the received data.

The present invention may be practiced in a network environment such as a communications network. Such networks are widely used to connect various types of network elements, such as routers, servers, gateways, and so forth. Further, the invention may be practiced in a multi-network environment having various, connected public and/or private networks.

Communication between network elements may be wireless or wireline (wired). As will be appreciated by those skilled in the art, communication networks may take several different forms and may use several different communication protocols. And the present invention is not limited by the forms and communication protocols described herein.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

Although the present invention has been described with reference to the particular embodiments herein set forth, it is understood that the present disclosure has been made only by way of example and that numerous changes in details of construction may be resorted to without departing from the spirit and scope of the invention. Thus, the scope of the invention should not be limited by the foregoing specifications, but rather only by the scope of the claims appended hereto.

What is claimed is:

1. An ion implantation system, comprising:
an ion source, wherein the ion source outputs an ion beam having a plurality of ions that propagate along a beam line;
a mass analyzer, wherein the mass analyzer generates a magnetic field, wherein the mass analyzer is positioned with respect to the ion beam outputted by the ion source such that the magnetic field bends a trajectory of each of the ions within the ion beam outputted from the ion source such that ions having a lower mass to charge ratio are bent more than ions having a higher mass to charge ratio, wherein the trajectory of each of the ions lies in a corresponding plane; and
a mass resolving aperture, wherein the mass resolving aperture has an opening;
wherein the mass resolving aperture is positioned such that a first portion of ions of the plurality of ions in the ion beam outputted from the mass analyzer as the ion beam approaches the mass resolving aperture passes through the opening and are in the ion beam after the ion beam exits the mass resolving aperture and the mass resolving aperture alters a motion of a second portion of ions of the plurality of ions in the ion beam as the ion beam approaches the mass resolving aperture such that the second portion of the ions of the plurality of ions are not in the ion beam after the ion beam exits the mass resolving aperture,
wherein the mass resolving aperture has an edge adjacent the opening, wherein the edge has a face surface and a side surface, wherein a normal to the face surface is parallel with the beam line of the ion beam outputted from the mass analyzer as the ion beam approaches the mass resolving aperture and in a direction opposite to the direction the ion beam propagates and a normal to the side surface is perpendicular to the beam line of the ion beam outputted from the mass analyzer as the ion beam approaches the mass resolving aperture, wherein at least a portion of the mass resolving aperture adjacent the face surface is segmented such that a first segment of the at least a portion of the mass resolving aperture adjacent the face surface has a different electric charge and/or a different magnetic polarity than a second segment of the at least a portion of the mass resolving aperture.

2. The ion implantation system according to claim 1, wherein the first segment of the at least a portion of the mass resolving aperture adjacent the face surface has an electric charge such that the first segment of the at least a portion of the mass resolving aperture adjacent the face surface attracts the ions of the plurality of ions in the second portion of ions of the plurality of ions.

3. The ion implantation system according to claim 2, wherein the first segment of the at least a portion of the mass resolving aperture adjacent the face surface has a positive electric charge such that the first segment of the at least a portion of the mass resolving aperture adjacent the face surface attracts the ions in the second portion of ions of the plurality of ions.

4. The ion implantation system according to claim 2, wherein the first segment of the at least a portion of the mass resolving aperture adjacent the face surface has a negative electric charge such that the first segment of the at least a portion of the mass resolving aperture adjacent the face surface attracts the ions in the second portion of ions of the plurality of ions.

5. The ion implantation system according to claim 2, wherein the first segment of the at least a portion of the mass resolving aperture adjacent the face surface has a different electric charge than the second segment of the at least a portion of the mass resolving aperture.

6. The ion implantation system according to claim 1, wherein the first segment of the at least a portion of the mass resolving aperture adjacent the face surface has an electric charge such that the first segment of the at least a portion of the mass resolving aperture adjacent the face surface repels the ions in the second portion of ions of the plurality of ions.

7. The ion implantation system according to claim 6, wherein the first segment of the at least a portion of the mass resolving aperture adjacent the face surface has a positive electric charge such that the first segment of the at least a portion of the mass resolving aperture adjacent the face surface repels the ions in the second portion of ions of the plurality of ions.

8. The ion implantation system according to claim 6, wherein the first segment of the at least a portion of the mass resolving aperture adjacent the face surface has a negative electric charge such that the first segment of the at least a portion of the mass resolving aperture adjacent the face surface repels the ions in the second portion of ions of the plurality of ions.

9. The ion implantation system according to claim 1, wherein the first segment of the at least a portion of the mass resolving aperture adjacent the face surface has a different magnetic polarity than the second segment of the at least a portion of the mass resolving aperture.

10. The ion implantation system according to claim 1, wherein the edge is a 90 degree edge.

11. The ion implantation system according to claim 1, wherein at least a portion of the edge adjacent the opening incorporates a fin, wherein the fin has a front surface and a rear surface,
wherein a normal to the front surface has a component that is parallel to the beam line of the ion beam outputted from the mass analyzer as the ion beam approaches the mass resolving aperture and in a direction opposite to a direction the ion beam propagates,
wherein a normal to the rear surface has a component that is parallel to the beam line of the ion beam as the ion beam exits the mass resolving aperture and in the direction the ion beam propagates,
wherein the fin has a leading portion on the front surface that has a normal to the leading portion on the front surface that is parallel to the beam line of the ion beam outputted from the mass analyzer as the ion beam approaches the mass resolving aperture and in the direction opposite to the direction the ion beam propagates,
wherein the front surface curves away from the leading portion on the front surface in a direction toward the opening to form an inner convex section of the front surface adjacent to the leading portion on the front surface, and wherein the front surface curves away from the leading portion on the front surface in the direction away from the opening to form an outer concave section of the front surface,
wherein at least a portion of the fin is segmented such that the first segment of the at least a portion of the mass resolving aperture adjacent the face surface is a first segment of the fin, wherein the first segment of the fin has a different electric charge or a different magnetic polarity than a second segment of the fin.

12. The ion implantation system according to claim 11, wherein the first segment of the fin has an electric charge such that the outer concave section of the front surface attracts the ions in the second portion of ions of the plurality of ions.

13. The ion implantation system according to claim 12, wherein the second segment of the fin has an electric charge that repels the ions of the plurality of ions in the second portion of ions of the plurality of ions.

14. The ion implantation system according to claim 11, wherein the front surface curves away from the leading portion on the front surface in a direction away from the opening to form an outer convex section of the front surface adjacent the leading portion adjacent the outer concave section of the front surface, and between the leading portion on the front surface and the outer concave section of the front surface.

15. The ion implantation system according to claim 14, wherein ions of the plurality of ions in the ion beam outputted from the mass analyzer as the ion beam approaches the mass resolving aperture that impact the inner convex section of the front surface are deflected out of the ion beam.

16. The ion implantation system according to claim 11, wherein ions of the plurality of ions in the ion beam outputted from the mass analyzer as the ion beam approaches the mass resolving aperture that impact the inner convex section of the front surface are deflected out of the ion beam.

17. The ion implantation system according to claim 11, wherein the first segment of the fin has a different magnetic polarity than the second segment of the fin.

18. The ion implantation system according to claim 11, wherein the first segment of the fin has a different electric charge than the second segment of the fin.

19. The ion implantation system according to claim 18, wherein a third segment of the fin has a neutral charge.

20. The ion implantation system according to claim 18, wherein the first segment of the fin has a positive electric charge than the second segment of the fin has a negative electric charge.

* * * * *